United States Patent
Lucarelli

(10) Patent No.: US 11,444,636 B2
(45) Date of Patent: Sep. 13, 2022

(54) SYSTEM AND METHODS FOR QUANTUM POST-SELECTION USING LOGICAL PARITY ENCODING AND DECODING

(71) Applicant: Error Corp., Bethesda, MD (US)

(72) Inventor: Dennis Lucarelli, Takoma Park, MD (US)

(73) Assignee: ERROR CORP., Bethesda, MD (US)

(*) Notice: Subject to any disclaimer, the term of this patent is extended or adjusted under 35 U.S.C. 154(b) by 391 days.

(21) Appl. No.: 16/600,323

(22) Filed: Oct. 11, 2019

(65) Prior Publication Data

US 2020/0119748 A1    Apr. 16, 2020

Related U.S. Application Data

(60) Provisional application No. 62/744,902, filed on Oct. 12, 2018, provisional application No. 62/866,248, filed on Jun. 25, 2019.

(51) Int. Cl.
| | |
|---|---|
| *H03M 13/11* | (2006.01) |
| *G06N 10/00* | (2022.01) |
| *H03M 13/00* | (2006.01) |
| *H03M 13/53* | (2006.01) |

(52) U.S. Cl.
CPC ........... *H03M 13/11* (2013.01); *G06N 10/00* (2019.01); *H03M 13/616* (2013.01)

(58) Field of Classification Search
None
See application file for complete search history.

(56) References Cited

U.S. PATENT DOCUMENTS

| | | | |
|---|---|---|---|
| 5,768,297 A * | 6/1998 | Shor | G06N 10/00 714/763 |
| 7,307,275 B2 | 12/2007 | Lidar et al. | |
| 8,510,618 B1 | 8/2013 | Pesetski et al. | |
| 2004/0000666 A1 * | 1/2004 | Lidar | B82Y 10/00 257/31 |

(Continued)

OTHER PUBLICATIONS

Wilde et al., Unified quantum convolutional coding, IEEE, Conference Paper, pp. 359-363 (Year: 2008).*

(Continued)

*Primary Examiner* — Cynthia Britt
*Assistant Examiner* — Dipakkumar B Gandhi
(74) *Attorney, Agent, or Firm* — Davis Wright Tremaine LLP; Heather M. Colburn

(57) ABSTRACT

A quantum computing system and associated methods. An exemplary method includes generating a specification from a binary matrix and at least one quantum check operator. The binary matrix is based at least in part on a classical error correcting code and the quantum check operator(s) is/are based on at least one multiple-qubit Pauli operator. The specification indicates which ancilla qubits are to be coupled to which data qubits. The data qubits are prepared as a plurality of multiple-qubit entangled states. The exemplary method also includes directing quantum hardware components of the quantum computing system to couple each of selected ones of the data qubits to one or more of the ancilla qubits in accordance with the couplings indicated in the specification. Each of the plurality of multiple-qubit entangled states is coupled to a plurality of the ancilla qubits.

39 Claims, 16 Drawing Sheets

(56) References Cited

U.S. PATENT DOCUMENTS

| | | | | |
|---|---|---|---|---|
| 2006/0059403 | A1* | 3/2006 | Watanabe | H04L 1/0057 714/758 |
| 2006/0262925 | A1* | 11/2006 | Matsumoto | H04L 9/0858 380/28 |
| 2014/0365843 | A1* | 12/2014 | Ashikhmin | H03M 13/1148 714/758 |
| 2015/0195087 | A1* | 7/2015 | Doi | H04L 9/0858 380/278 |
| 2016/0112066 | A1 | 4/2016 | Ashikhmin | |
| 2018/0053112 | A1 | 2/2018 | Bravyi et al. | |
| 2018/0269906 | A1 | 9/2018 | Haah et al. | |

OTHER PUBLICATIONS

Sheng-Mei Zhao et al., a construction method of quantum low density parity check code based on projective geometry, IEEE, Conference Paper, pp. 1-5. (Year: 2009).*

Bravyi, Sergey and Kitaev, Alexei, "Universal quantum computation with ideal clifford gates and noisy ancillas," Phys. Rev. A, 71:022316, Feb. 2005, 14 pages.

Campbell, Earl T., and Browne, Dan E., "On the structure of protocols for magic state distillation." In Workshop on Quantum Computation, Communication, and Cryptography, pp. 20-32. Springer, Berlin, Heidelberg, 2009.

Johnson, Sarah J., "Iterative error correction: Turbo, low-density parity-check and repeat-accumulate codes," Cambridge university press, pp. 48-119, 2009.

Knill, Emanuel, "Fault-tolerant postselected quantum computation: Schemes," arXiv preprint quant-ph/0402171, 2004, 17 pages.

Liu, Ye-Hua and Poulin, David, "Neural belief-propagation decoders for quantum error-correcting codes," Physical review letters, 122(20):200501, 2019, 6 pages.

Lugosch, Loren and Gross, Warren J., "Learning from the syndrome," In 2018 52nd Asilomar Conference on Signals, Systems, and Computers, pp. 594-598. IEEE, 2018.

Peterson, Wesley Peterson, and Weldon, EJ "Error-Correcting codes," MIT press, pp. 116-355, 1972.

Reichardt, Ben, "Quantum universality from magic states distillation applied to css codes," Quantum Information Processing, 4(3):251-264, 2005.

Shor, Peter W., "Fault-tolerant quantum computation," In Proceedings of 37th Conference on Foundations of Computer Science, IEEE, 1996, 11 pages.

Steane, Andrew M, "Active stabilization, quantum computation, and quantum state synthesis," Physical Review Letters, 78(11):2252-2255, 1997.

International Search Report and Written Opinion, dated Feb. 3, 2020 received in International Application No. PCT/US2019/055991.

* cited by examiner $$\begin{bmatrix} 1 & 1 & 0 \\ 0 & 1 & 1 \\ 1 & 0 & 1 \end{bmatrix} \otimes \begin{bmatrix} 1 & 0 & 1 \end{bmatrix} =$$

$$\begin{bmatrix} 1 & 0 & 1 & 1 & 0 & 1 & 1 & 0 & 1 & 0 & 0 & 0 \\ 0 & 0 & 0 & 1 & 0 & 1 & 1 & 0 & 1 & 1 & 0 & 1 \\ 1 & 0 & 1 & 1 & 0 & 1 & 0 & 0 & 0 & 1 & 0 & 1 \end{bmatrix} \begin{matrix} |A_1\rangle \\ |A_2\rangle \\ |A_3\rangle \end{matrix}$$

$|\psi_1\rangle\ |\psi_2\rangle\ |\psi_3\rangle\ |\psi_4\rangle\ |\psi_5\rangle\ |\psi_6\rangle\ |\psi_7\rangle\ |\psi_8\rangle\ |\psi_9\rangle\ |\psi_{10}\rangle\ |\psi_{11}\rangle\ |\psi_{12}\rangle$ 122, 124, 120

FIG. 4

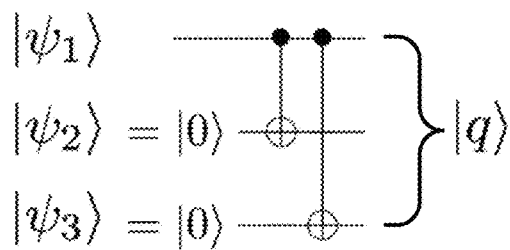
FIG. 6A
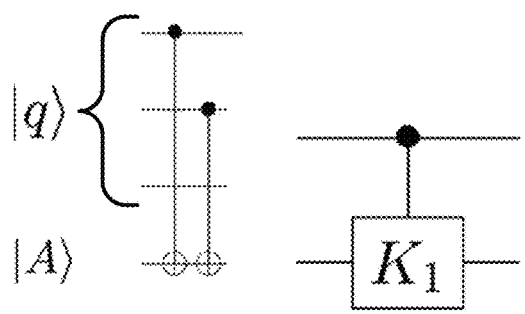
FIG. 6B
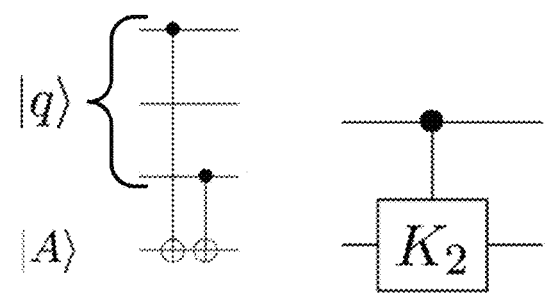
FIG. 6C
| Syndrome | Error |
|---|---|
| 00 | No Error |
| 01 | Qubit 3 |
| 10 | Qubit 2 |
| 11 | Qubit 1 |
134
FIG. 6D 
SYSTEM AND METHODS FOR QUANTUM POST-SELECTION USING LOGICAL PARITY ENCODING AND DECODING

CROSS REFERENCE TO RELATED APPLICATIONS

This application claims the benefit of both U.S. Provisional Application No. 62/744,902, filed on Oct. 12, 2018, and U.S. Provisional Application No. 62/866,248, filed on Jun. 25, 2019, which are each incorporated herein by reference in their entireties.

BACKGROUND OF THE INVENTION

Field of the Invention

The present disclosure relates generally to the field of quantum computing. More specifically, the invention relates to systems and methods for quantum error detection, location, and correction; quantum state distillation; quantum state preparation and verification; and quantum post selection.

Description of the Related Art

The field of quantum computing relies on a number of procedures for detecting, locating, and correcting errors that occur in the course of a computation. Quantum states involved in these processes can be generally partitioned into data quantum bits ("qubits") and ancilla qubits (also referred to as "ancilla"). Data qubits store quantum information. Ancilla qubits are measured to non-destructively extract information from the data qubits. Multiple ancilla qubits may be prepared in entangled states and used as "ancilla blocks" for performing fault-tolerant operations.

Quantum error correcting codes encode quantum states in multiple data qubits to create a quantum codeword. Quantum codewords may encode one or more logical qubits. Quantum logic gates are performed on the logical qubits to execute a quantum algorithm. Errors may occur in the data qubits representing the quantum codewords due to faulty quantum logic gates or random errors while the data qubits are idle. To detect and correct errors, the data qubits representing the quantum codewords are coupled to ancilla qubits (or ancilla blocks) that are measured to determine a quantum error syndrome. The quantum error syndrome is then used to infer a location and type of error occurring in the quantum codeword. Qubits may be coupled by performing multiple-qubit logic gates on two or more qubits. Single qubit gates may also be performed on a data qubit or an ancilla qubit. The term "quantum post-selection" is used to describe the inference of quantum information based on measurements of ancilla qubits and any subsequent action taken based on the measurement data. Quantum error correcting codes and ancilla qubits are used in a number of processes needed for quantum computing including quantum memory, quantum error detection and correction, quantum state distillation, entangled ancilla preparation and verification, fault-tolerant encoding, and fault-tolerant measurement.

BRIEF DESCRIPTION OF THE SEVERAL VIEWS OF THE DRAWINGS

The features, objects, and advantages of the invention will become more apparent from the detailed description when considered in connection with the following drawings.

FIG. 4 illustrates an example construction of a logical parity-check matrix that is a Kronecker product of at least one quantum check operator and a binary matrix associated with a classical linear parity-check code.

FIG. 6A illustrates an encoding of an example quantum state using three data qubits to prepare a three-qubit bit-flip quantum codeword.

FIG. 6B illustrates couplings between the quantum codeword of FIG. 6A and an ancilla qubit that define a quantum check operator K1 for the three-qubit bit-flip quantum code.

FIG. 6C illustrates couplings between the quantum codeword of FIG. 6A and the ancilla qubit that define a quantum check operator K2 for the three-qubit bit-flip quantum code.

FIG. 6D illustrates an exemplary embodiment of a look up table of a quantum decoder that determines the data qubit with an error from a quantum error syndrome for the three-qubit bit-flip quantum code.

DETAILED DESCRIPTION OF THE INVENTION

In conventional digital computing, data compression is often used to reduce the size of data by encoding the data with an error correcting code. In particular, a parity-check code can be used to compress a binary data source by computing a set of parity-check conditions on the binary data source to produce a reduced representation of the binary data source called a syndrome. The syndrome representing the binary data source is then stored. Upon retrieval of the syndrome, a reverse process, called decoding, is performed on the syndrome to reconstruct the original binary data source and correct any errors that may have occurred during storage and/or retrieval. The term "source coding" is often used to refer to data compression using error correcting codes. Parity-check codes may also be used for channel coding to send data over a noisy channel. In channel coding, the parity-check code may expand the data by producing a syndrome having a length that is greater than the length of the original binary data source (e.g., a message) and transmit the message in addition to the syndrome.

Methods and systems for using data compression, channel coding, and linear parity-check codes to detect and locate errors in quantum computing and related processes are described below. The term "error location" is used to describe the process that determines where an error has occurred once an error has been detected. Throughout this disclosure, binary addition and multiplication are performed modulo 2 (e.g., 1+0=1, 0+1=1, 1+1=0, and 0+0=0). The term "classical error correcting code" will be used to refer to an error correcting code designed for binary data source in conventional digital computing. The term "quantum error correcting code" will be used to refer to an error correcting code designed for quantum data in quantum computing.

Figure 17:
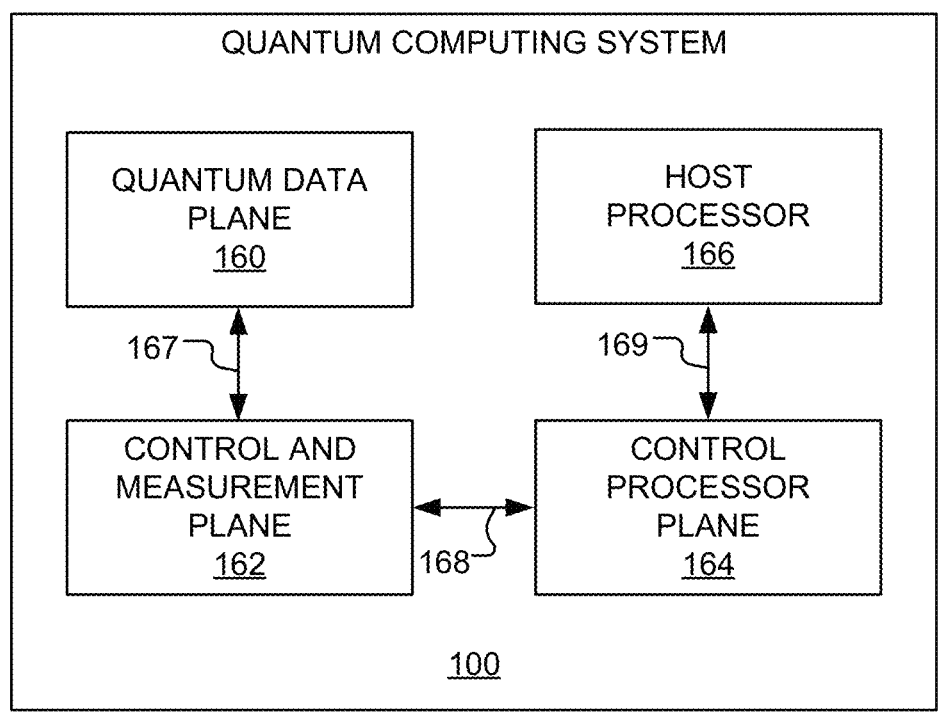
FIG. 17 is a block diagram illustrating an exemplary quantum computing system configured to implement the quantum system of FIG. 1.

FIG. 17 illustrates a quantum computing system 100 implemented by hardware that may be conceptualized or modeled as including a quantum data plane 160, a control and measurement plane 162, a control processor plane 164, and a host processor 166.

Data qubits and ancilla qubits reside in the quantum data plane 160. The quantum data plane 160 provides any circuitry needed to measure states of the qubits and to perform operations on the qubits. For example, the quantum data plane 160 may include a programmable "wiring" network commonly referred to as a "quantum circuit") that enables two or more of the qubits to interact. Thus, the quantum data plane 160 may be used to couple selected ones of the data qubits to one or more of the ancilla qubits. The quantum data plane 160 is controlled by the control and measurement plane 162. Thus, a communication link 167 connects the control and measurement plane 162 to the quantum data plane 160.

The control and measurement plane 162 receives signals (e.g., instructions) from the control processor plane 164 indicating which quantum operations the quantum data plane 160 is to perform on the qubits. Thus, a communication link 168 connects the control and measurement plane 162 to the quantum data plane 160. The signals may be digital signals (e.g., encoded in binary) that the control and measurement plane 162 must convert into analog signals that can be understood and performed by the quantum data plane 160. The control and measurement plane 162 may also convert analog output received from the quantum data plane 160 (via the communication link 168) into digital signals (e.g., encoded in binary) to be transmitted to the control processor plane 164. The analog output may include measurement data obtained for qubits. The control and measurement plane 162 may convert the analog measurement data into binary measurement outcomes and transmit them to the control processor plane 164.

The control processor plane 164 identifies and triggers quantum operations (e.g., gates) and measurements that are performed by the control and measurement plane 162 on the quantum data plane 160. In other words, the control processor plane 164 determines a sequence of quantum operations and measurements required by a particular quantum algorithm and communicates instructions to the control and measurement plane 162 via a communication link 169 that connects the control processor plane 164 to the control and measurement plane 162. The control and measurement plane 162 is configured to execute the instructions received from the control processor plane 164. The instructions execute a software program (provided by the host processor 166) that implements the particular quantum algorithm.

The host processor 166 provides conventional computing components (e.g., a user interface and memory) to the quantum computing system 100. For example, the host processor 166 may provide software development tools and services used to create the particular quantum algorithm. The host processor 166 may be composed of an integrated circuit, a field programmable gate array, or a conventional computer (e.g., a computing device 12 illustrated in FIG. 18 and described below) that decodes in real time the measurement outcomes and triggers one or more appropriate corrective actions to the control and measurement plane 162 governing the operation of the quantum data plane 160.

Together, the quantum data plane 160 and the control and measurement plane 162 may be characterized as being quantum hardware components and together the control processor plane 164 and the host processor 166 may be characterized as being classical digital hardware components.

The quantum computing system 100 is configured to implement logical parity encoding and logical parity decoding methods 170 and 180 (see FIGS. 15 and 16, respectively) that stand in contrast to the conventional approach for quantum error correction, where a separate ancilla qubit or block of entangled ancilla is obtained for and dedicated to each quantum codeword. In the logical parity encoding and logical parity decoding methods 170 and 180, each quantum codeword is coupled to multiple ancilla qubits and, accordingly, each ancilla qubit holds error information for several quantum codewords. The logical parity encoding and logical parity decoding methods 170 and 180 and the quantum computing system 100 configured to perform these methods may reduce the number of ancilla qubits required for quantum memory, quantum error detection, location and correction, state distillation and verification, and other forms of quantum post selection.

Figure 1:
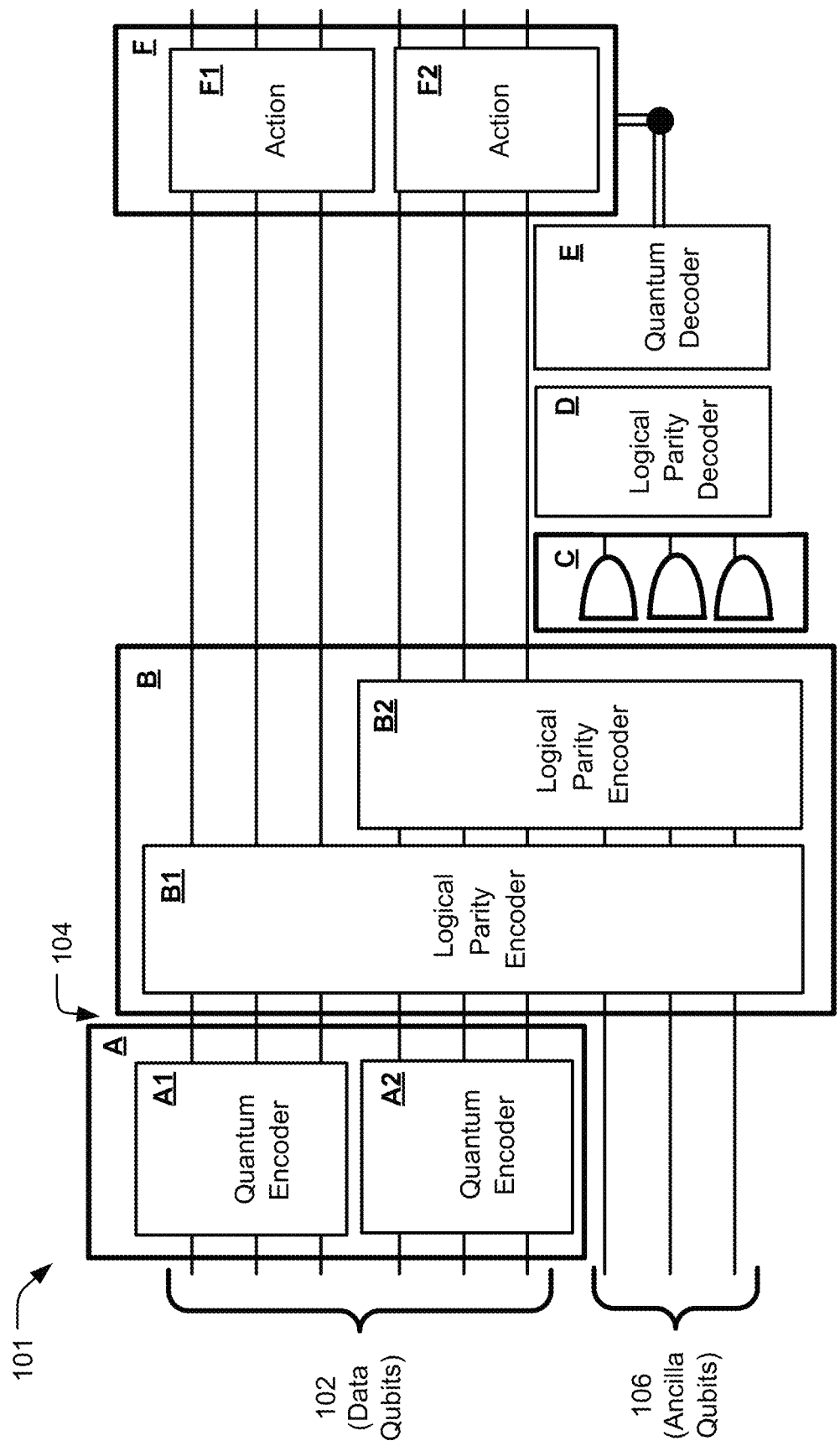
FIG. 1 illustrates a quantum system that includes a logical parity encoder and a logical parity decoder and is configured to perform quantum encoding, measurement, quantum decoding, post-selection and correction.

FIG. 1 illustrates a quantum system 101 implemented by the quantum computing system 100 (see FIG. 17). The quantum system 101 is configured with a parity-check code and a quantum error correcting code that are used to detect and locate errors in quantum computing and related processes. The quantum system 101 includes a quantum encoder A, a logical parity encoder B, a measurement apparatus C, a logical parity decoder D, a quantum decoder E, and an action component F. As is apparent to those of ordinary skill in the art, a plurality of data qubits 102, a plurality of ancilla qubits 106, and the measurement apparatus C reside in the quantum data plane 160 (see FIG. 17). The quantum encoder A, the logical parity encoder B, the logical parity decoder D, the quantum decoder E, and the action component F may be implemented in software executing on the host processor 166 (see FIG. 17). However, these components may communicate with the quantum data plane 160 via the control and measurement plane 162 (see FIG. 17) and the control processor plane 164 (see FIG. 17). The quantum encoder A, the measurement apparatus C, the quantum decoder E, and the action component F may each be implemented using conventional components and may each operate in the usual manner as prescribed by the methods of quantum error correction, quantum state distillation, or quantum state verification.

For ease of illustration, the quantum encoder A has been illustrated as including two portions A1 and A2. However, the quantum encoder A may include any number of portions and the portions A1 and A2 may be implemented as a single quantum encoder. Similarly, the logical parity encoder B has been illustrated as including the two portions B1 and B2. However, the logical parity encoder B may include any number of portions and the portions B1 and B2 may be implemented as a single logical parity encoder. Additionally, the action component F has been illustrated as including two portions F1 and F2. However, the action component F may include any number of portions and the portions F1 and F2 may be implemented as a single action component.

In FIG. 1, the quantum encoder A receives the plurality of data qubits 102 and produces a plurality of quantum codewords 104 (illustrated as lines or "wires" output by the quantum encoder A). In the embodiment illustrated, the portion A1 of the quantum encoder A encodes a first portion of the data qubits 102 into a first portion of the quantum codewords 104 using a quantum code. Similarly, the portion A2 of the quantum encoder encodes a second portion of the data qubits 102 into a second portion of the quantum codewords 104 using the quantum code. The plurality of quantum codewords 104 are used to carry the quantum information.

To execute a quantum algorithm, quantum logic gates (not shown in FIG. 1) are performed on the logical qubits contained in the quantum codewords 104 by the quantum data plane 160 (see FIG. 17). Errors that occur during the execution of quantum logic gates on the quantum codewords 104 or when the quantum codewords 104 are idle must be detected, located, and corrected by an error correcting procedure, such as the logical parity encoding and the logical parity decoding methods 170 and 180 (see FIGS. 15 and 16, respectively).

After one or more logic gates are performed on the data qubits (e.g., during the quantum algorithm), the logical parity encoder B couples the quantum codewords 104 to the ancilla qubits 106 so that the logical parity decoder D may extract information about errors from the quantum codewords 104 without destroying the quantum information held in the quantum codewords 104. Thus, after the quantum encoder A produces the quantum codewords 104, the quantum logic gates of the quantum algorithm are performed on the logical qubits contained in the quantum codewords 104. After the quantum logic gate(s), the logical parity encoder B performs the logical parity encoding method 170 (see FIG. 15), which couples each of the quantum codewords 104 (see FIG. 1) to multiple ancilla qubits. In FIG. 1, the portion B1 of the logical parity encoder B couples the quantum codewords 104 received from the portion A1 of the quantum encoder A to the ancilla qubits 106 and similarly the portion B2 of the logical parity encoder B couples the quantum codewords 104 received from the portion A2 of the quantum encoder A to the ancilla qubits 106.

Next, the ancilla qubits 106 are measured by the measurement apparatus C to obtain measurement data, which is communicated to the host processor 166 (see FIG. 17) by the control and measurement plane 162 and the control processor plane 164 as binary valued measurement outcomes. The resulting binary valued measurement outcomes (referred to as a "logical parity syndrome" in the following) and a binary matrix (e.g., a parity-check matrix, a sub-parity-check matrix, a parity-check matrix pre-multiplied by a generator matrix, and the like) associated with a classical error correcting code are sent to the logical parity decoder D. Then, the logical parity decoder D performs a logical parity decoding method 180 (see FIG. 16) that uses the measurement outcomes to infer where errors (if any) occurred in the quantum codewords 104.

Some quantum post-selection tasks, including quantum error correction and quantum state distillation as non-limiting examples, may require measuring multiple quantum check operators to calculate the measurement outcomes used by the logical parity decoder D. Thus, the logical parity encoder B, the measurement apparatus C, and the logical parity decoder D may be configured to construct a "full logical parity syndrome" by measuring multiple quantum check operators in a sequential or parallel configuration. Using the full logical parity syndrome, the logical parity decoder D may complete the identification of error types and locations. Non-limiting examples of error types include bit-flips (e.g., Pauli-X type errors) and phase flips (e.g., Pauli-Z type errors).

Some quantum error correcting codes may require additional processing to disambiguate complex error patterns. In these cases, the quantum error syndrome associated with the chosen quantum error correcting code may be computed from the full logical parity syndrome and passed to the quantum decoder E, which operates in the usual manner, to identify the error types and any of the data qubits containing errors. The error types and error locations produced by the logical parity decoder D or the quantum decoder E are then passed to the action component F, which applies one or more corrective actions to any of the data qubits 102 with errors to thereby restore the data qubits 102 to their correct original state prior to the error(s) having occurred. By restoring the data qubits 102 to their correct and original states existing prior to the error(s) having occurred, the quantum codewords 104 are also restored to their states prior to the error(s) having occurred.

The arrangement of data qubits into quantum codewords generally depends on the quantum error correcting code and the qubit device (in the quantum data plane 160 illustrated in FIG. 17) used in operation. The logical parity encoder B and the logical parity decoder D are compatible with an arbitrary arrangement of data qubits into quantum codewords. In other words, the logical parity encoder B and the logical parity decoder D both function or may be configured to function with any arrangement of the data qubits 102 into the quantum codewords 104.

Figure 2:
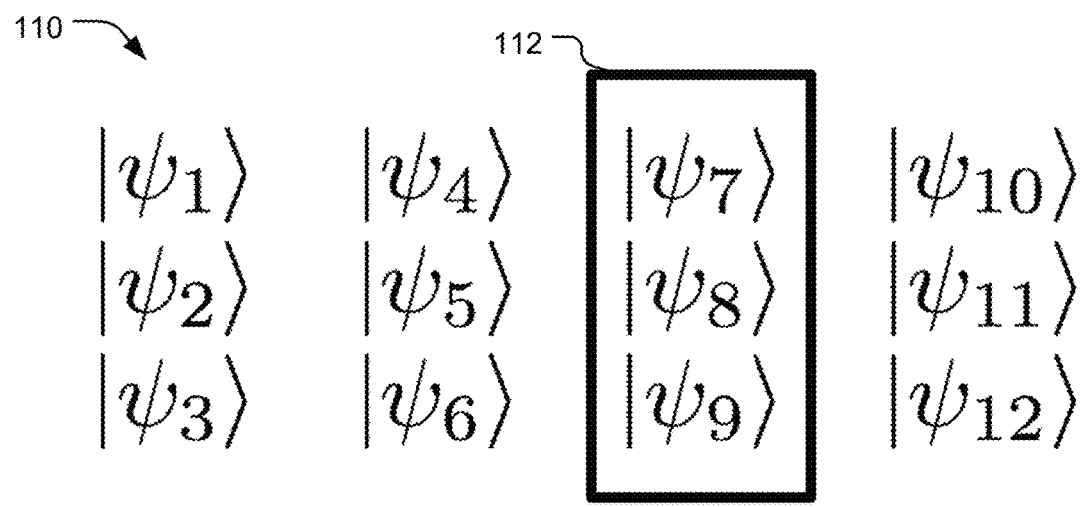
FIG. 2 illustrates a rectangular arrangement of data qubits.

Referring to FIG. 2, the logical parity encoder B may conceptually arrange the data qubits 102 (see FIG. 1) in a rectangular array 110. In the example illustrated in FIG. 2, the rectangular array 110 includes twelve data qubits, illustrated as values $|\psi_4\rangle$ for $|\psi_9\rangle$, arranged in three rows and four columns. Each of the columns may represent a different quantum codeword (e.g., a codeword 112).

Figure 3:
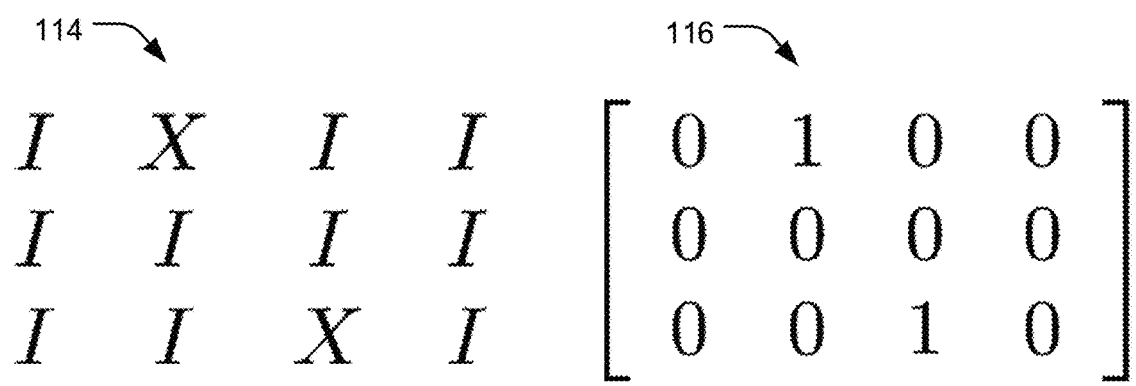
FIG. 3 illustrates a rectangular arrangement of error patterns and a mapping from Pauli-operator errors to binary matrices used by the logical parity decoder.

Referring to FIG. 1, the logical parity decoder D infers error patterns acting on the data qubits 102 that may include Pauli-X errors (quantum bit-flips) and Pauli-Z errors (quantum phase flips) as non-limiting examples. An error pattern acting on the data qubits 102 may be represented by an array containing identity operators and error operators with dimensions matching the rectangular representation (e.g., the rectangular array 110 illustrated in FIG. 2) of the data qubits 102. As a non-limiting example, FIG. 3 illustrates Pauli-X errors acting on the data qubits $|\psi_4\rangle$ and $|\psi_9\rangle$. The logical parity decoder D may represent the error pattern by a rectangular array 114 that includes X operators (each identified by the letter "X") and identity operators (each identified by the letter "I"). In the rectangular array 114, the letter "X" indicates an Pauli-X error has occurred on corresponding data qubit. On the other hand, the letter "I" indicates an identify operator and that no error has occurred on corresponding data qubit. Thus, FIG. 3 illustrates the letter "X" in positions corresponding to the data qubits $|\psi_4\rangle$ and $|\psi_9\rangle$ that have Pauli-X errors. Alternatively, the error pattern may also be represented by a binary rectangular array 116 with dimensions matching those of the rectangular array 110. In the binary rectangular array 116, an entry with a value of "1" indicates an error occurred on the corresponding data qubit and an entry with a value of "0" indicates that no error has occurred on the corresponding data qubit.

Logical Parity Encoding Method

Figure 15:
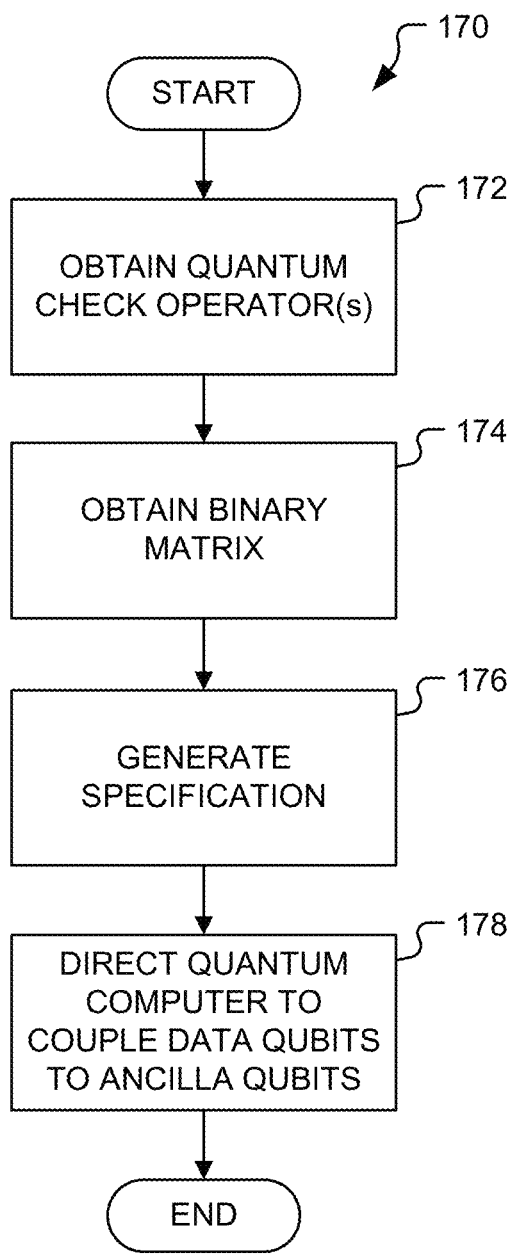
FIG. 15 is a flow diagram of a logical parity encoding method performed by the logical parity encoder of FIG. 1.

FIG. 15 is a flow diagram of the logical parity encoding method 170 performed by the logical parity encoder B (see FIG. 1). The logical parity encoding method 170 couples each of the quantum codewords 104 (see FIG. 1) to multiple ancilla qubits according to a binary matrix associated with a classical error correcting code.

In first block 172, the logical parity encoder B obtains one or more quantum check operators (represented by a variable S). Referring to FIG. 1, the logical parity encoder B and logical parity decoder D may be configured to operate with a variety of quantum error detecting and quantum error correcting codes, including as non-limiting examples, the Calderbank-Shor-Steane ("CSS") codes, quantum erasure codes, topological codes, surface codes, quantum Bose-Chaudhuri-Hocquenghem codes, quantum low-density parity-check ("LDPC") codes, the Bacon-Shor code, the Steane code, and the three-qubit bit-flip code. The chosen quantum error detecting or quantum error correcting code is implemented by the quantum encoder A and specifies a set of quantum check operators that must be encoded by the logical parity encoder B and decoded by the logical parity decoder D. By way of a non-limiting example, the logical parity encoder B may obtain the quantum check operator(s) from the quantum encoder A. Alternatively, the quantum check operator(s) may be parameter(s) set by a user.

The term "quantum check operator" is used to specify how the data qubits 102 are coupled to the ancilla qubits 106 for a single quantum codeword or multiple-qubit entangled state. The quantum check operator used by the logical parity encoder B depends on the chosen error location and post-selection task. By way of non-limiting examples, quantum check operators compatible with the logical parity encoder B and the logical parity decoder D include (1) a quantum stabilizer operator associated with a quantum error correcting code may be used for error location and correction (as explained below and illustrated in FIGS. 6A-8 for the example of the three-qubit bit-flip quantum code), (2) a quantum stabilizer operator may be used for state-distillation and (3) a state verification circuit for entangled state preparation and verification.

The quantum check operator(s) may be expressed as a vector, an array, a matrix, and the like. Further, the quantum check operator(s) may be expressed as a binary vector, binary array, binary matrix, and the like, that include entries each having a value selected from a set of two values (e.g., one or zero). The quantum check operator(s) are based on at least one multiple-qubit Pauli operator. For example, the value "X" may be used to denote a Pauli-X operator (bit-flip error) and the value "Z" may be used to denote a Pauli-Z operator (phase-flip error). In such embodiments, the variable S may store a binary matrix created by associating the value "1" with a Pauli operator and the value "0" with the identity operator. As a non-limiting example, if the quantum check operator is "ZIZ," the variable S may store a binary vector [1 0 1].

Next, in block 174, the logical parity encoder B obtains a binary matrix (represented by a variable H). The binary matrix is based at least in part on a classical error correcting code. By way of non-limiting examples, the classical error correcting code may be a parameter set by the user or selected by the logical parity encoder B.

The binary matrix may be based at least in part on a classical error correcting code that uses an array of N bits to encode an array of K message bits, using M=N−K redundancy (or parity) bits. An error correcting code capable of correcting a number "t" of errors is denoted as [N,K,t]. Referring to FIG. 1, when the logical parity encoder B and the logical parity decoder D are configured with a [N,K,t] classical error correcting code, they may detect and locate at least the number "t" errors occurring in the data qubits 102.

The binary matrix (represented by the variable H) may be implemented as a binary parity-check matrix, denoted $H_L$. A parity-check code may be specified by an M×N dimensional binary parity-check matrix, denoted $H_L$. Parity-check codes and associated decoding algorithms are well known to those of ordinary skill in the art and will not be described in detail. However, by way of non-limiting examples, Hamming codes, Reed-Muller codes, Bose-Chaudhuri-Hocquenghem ("BCH") codes, low-density parity-check ("LDPC") codes, Polar Codes and one or more of the codes described in references [1] and [2] below may be used by the logical parity encoder B and the logical parity decoder D. Alternatively, the binary matrix (represented by the variable H) may be implemented as a sub-parity-check matrix $P_L$. The parity-check matrix $H_L$ may be expressed in systematic form $H_L=[I \ P_L]$ with the M x K dimensional sub-parity-check matrix $P_L$ and M×M identity matrix I. The logical parity encoder B and the logical parity decoder D may be implemented with either the full parity-check matrix $H_L$ or the sub-parity-check matrix $P_L$. When the classical error correcting code is a [N,K,t] classical error correcting code wherein M=N−K is the number of quantum check operators (commonly referred to as "stabilizers"), a number "N: of the quantum codewords are coupled if the variable H represents the parity-check matrix $H_L$. A number "K" of the quantum codewords are coupled when the variable H represents the sub-parity-check matrix $P_L$.

By way of another example, the binary matrix (represented by the variable H) may be implemented as a generator matrix G of a parity-check code. As known to those of ordinary skill in the art, a parity-check code may alternatively be specified by its generator matrix denoted by G and expressed in systematic form $G=[P_L^T I]$.

Then, in block 176, the logical parity encoder B generates a specification from the binary matrix (represented by the variable H) and the quantum check operator(s) (represented by the variable S). The specification indicates which of the ancilla qubits 106 (see FIG. 1) are to be coupled to which of the data qubits 102 (see FIG. 1) in the quantum codewords 104 (see FIG. 1). The specification may be based at least in part on a resultant matrix (represented by a variable $R_M$) that is a matrix Kronecker product (represented by a symbol "⊗") of the binary matrix and a binary representation of the quantum check operator(s). The binary representation (represented by the variable S) includes entries each having a value selected from the set of two values (e.g., one or zero). Thus, the specification may be generated in accordance with Equation 1 below:

$$R_M = H \otimes S \quad \text{Equation 1}$$

In the following example, the binary matrix has been implemented as the parity-check matrix $H_L$, which is a binary parity-check matrix associated with a classical error correcting code, and the variable S has been implemented as a binary vector. Referring to FIG. 1, the logical parity encoder B may be configured to couple the data qubits 102 encoded as the quantum codewords 104 to the ancilla qubits 106 according to the resultant matrix $R_M$ formed by the Kronecker product of the parity-check matrix $H_L$ and the variable S (which represents the quantum check operator(s)) as expressed in the Equation 2 (below):

$$R_M = H_L \otimes S = \begin{bmatrix} h_{11}S & h_{12}S & \ldots & h_{1N}S \\ h_{21}S & h_{22}S & \ldots & h_{2N}S \\ \vdots & \vdots & \vdots & \vdots \\ h_{M1}S & h_{M2}S & \ldots & h_{MN}S \end{bmatrix} \quad \text{Equation 2}$$

In Equation 2, each of the variables $h_{ij}$ is a binary number located in the i-th row and j-th column of the parity-check matrix $H_L$. As mentioned above, in Equation 2 and throughout this disclosure, binary addition and multiplication are performed modulo 2 (e.g., 1+0=1, 0+1=1, 1+1=0 and 0+0=0). As mentioned above, the parity-check matrix $H_L$ has dimensions M×N. The binary vector represented by the variable S has length "n." The resultant matrix $R_M$ (or matrix product $H_L \otimes S$) is referred to as a "logical parity-check matrix," and has M rows and N·n columns.

Figure 5:
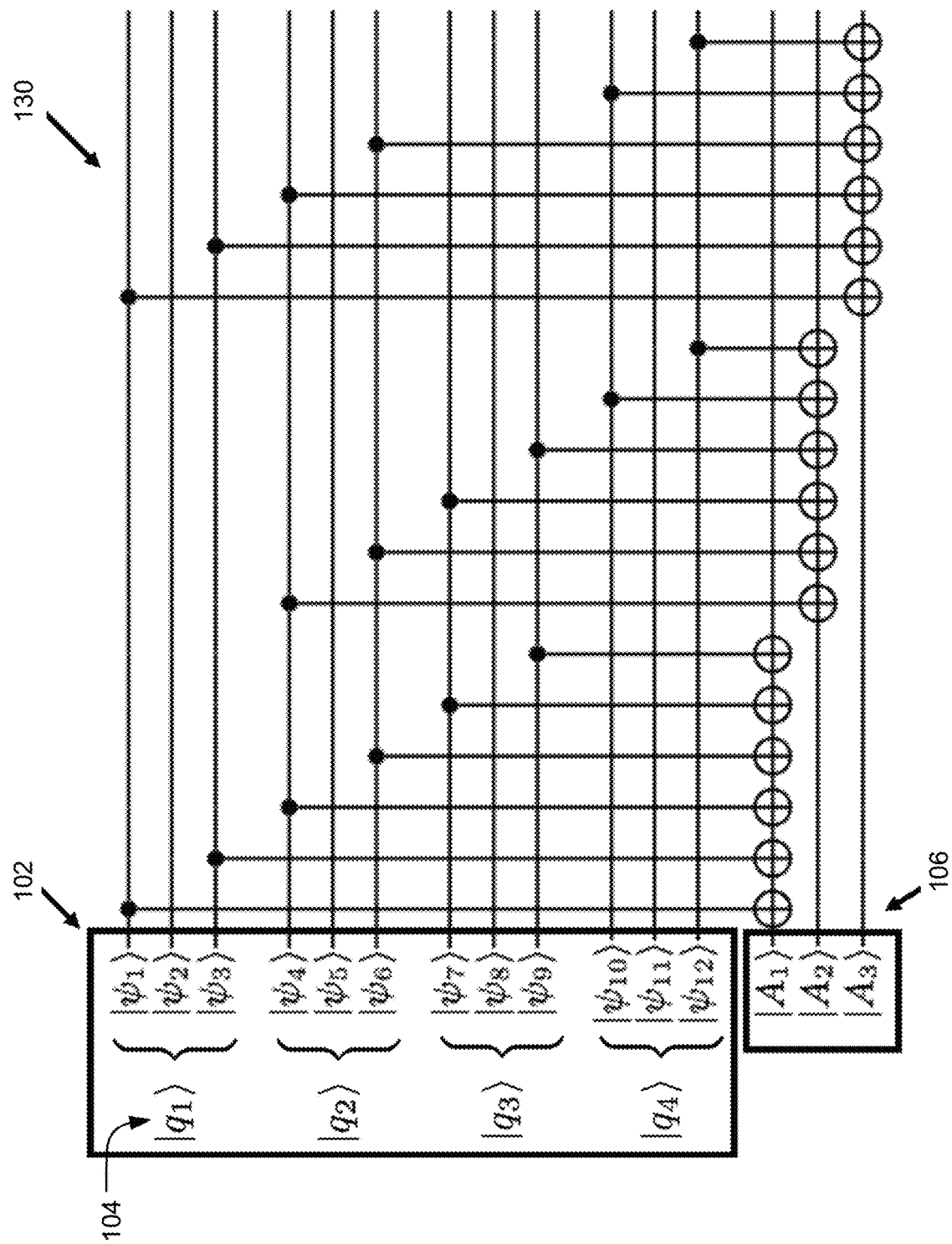
FIG. 5 illustrates an example quantum circuit implemented by the logical parity encoder, which couples data qubits to ancilla qubits according to the logical parity-check matrix illustrated in FIG. 4.

FIG. 4 illustrates an example logical parity-check matrix 120 formed by the Kronecker product of a binary matrix 122 (which is the sub-parity-check matrix $P_L$ of a Hamming [7,4,3] classical error correcting code) and the binary representation of the quantum check operator "ZIZ" 124 (which is a binary vector represented by the variable S). The quantum check operator "ZIZ" is an example "multiple-qubit Pauli Operator." The rows of the logical parity-check matrix 120 are illustrated as values $|A_i\rangle$ corresponding to the ancilla qubits 106 (see FIG. 1), and the columns are illustrated as values $|\psi_j\rangle$ corresponding to the data qubits 102 (see FIG. 1) in the quantum circuit illustrated in FIG. 5. The specification includes entries each having a value selected from the set of two values (e.g., one or zero). Referring to FIG. 5, after the specification is generated, the logical parity encoder B (see FIG. 1) may construct a quantum circuit 130 in accordance with the specification. Referring to FIG. 17, as explained above, the logical parity encoder B is executed by the host processor 166. Instructions issued by the logical parity encoder B executing on the host processor 166 are passed to the control processor plane 164, which identifies and triggers quantum operations (e.g., gates) and measurements to be performed by the control and measurement plane 162 on the quantum data plane 160. In this manner, the logical parity encoder B constructs the quantum circuit 130.

For example, the logical parity encoder B (see FIG. 1) may construct the quantum circuit 130 from the resultant matrix $R_M$ by coupling a number N×n (which is the number of columns of the resultant matrix $R_M$) of the data qubits 102 to a number M (which is the number of rows of the resultant matrix $R_M$) of the ancilla qubits 106 as follows. A multiple-qubit gate, which may include a controlled-NOT gate ("CNOT gate") or a controlled-PHASE gate ("CPHASE gate") as non-limiting examples, couples data qubit "j" (illustrated as values $|\psi_j\rangle$ below the logical parity-check matrix 120 in FIG. 4) to ancilla qubit "i" (illustrated as values $|A_i\rangle$ to the right of the logical parity-check matrix 120 in FIG. 4) if, and only if, the binary number located in the i-th row and j-th column of the logical parity-check matrix 120 is "1." On the other hand, if the binary number located in the i-th row and j-th column of the logical parity-check matrix 120 is "0," the data qubit $|\psi_j\rangle$ remains uncoupled from the ancilla qubit $|A_i\rangle$.

In block 178 of FIG. 15, the logical parity encoder B (see FIG. 1) directs the quantum hardware components to couple each of selected ones of the data qubits 102 (see FIG. 1) to one or more of the ancilla qubits 106 (see FIG. 1) in accordance with the couplings indicated in the specification. The data qubits 102 may be coupled to the ancilla qubits 106 by performing quantum logic gates (e.g., multiple-qubit logic gates and/or single qubit gates) on the data qubits 102 and the ancilla qubits 106. Qubits may be coupled by performing multiple-qubit logic gates on two or more qubits. A single qubit gate may be performed on a data qubit or an ancilla qubit. The quantum circuit 130 illustrated in FIG. 5 implements the logical parity-check matrix 120 (see FIG. 4). As mentioned above, the data qubits $|\psi_j\rangle$ were grouped into the quantum codewords 104 (illustrated as values $|q_j\rangle$) by the quantum encoder A (see FIG. 1). In the quantum circuit 130, the quantum codewords 104 are coupled to the ancilla qubits 106 (illustrated as values $|A_i\rangle$) by CNOT gates (illustrated as vertical lines starting at the control data qubit and terminating with a cross at the target ancilla qubit) if, and only if, the binary number located in the i-th row and j-th column of the logical parity-check matrix 120 is equal to "1."

Then, the logical parity encoding method 170 terminates.

In the above example, the quantum check operator(s) (represented by the variable S) included only a single quantum check operator allowing the variable S to represent a binary vector. For quantum post-selection applications requiring measurement from multiple quantum check operators, including quantum error correction and quantum state distillation as non-limiting examples, a logical parity-check matrix may be formed by the Kronecker product of the parity-check matrix $H_L$ and a matrix, denoted $H_Q$, formed by arranging the binary representation of the quantum check operators as rows. In other words, the variable S may represent the matrix $H_Q$. In the case of a number "R" of quantum check operators ($S_1, S_2, \ldots, S_R$), the resultant matrix $R_M$ may be expressed as the Kronecker product of the parity-check matrix $H_L$ and the binary matrix $H_Q$ formed by arranging the check operators ($S_1, S_2, \ldots, S_R$), as rows. This relationship is depicted in Equation 3 below:

$$R_M = H_L \otimes H_Q = H_L \otimes \begin{bmatrix} - & S_1 & - \\ - & S_2 & - \\ \vdots & \vdots & \vdots \\ - & S_R & - \end{bmatrix} \quad \text{Equation 3}$$

For a parity-check matrix $H_L$ with dimensions M×N and the number "R" of check operators of length n, the resultant matrix $R_M$, which may be referred to as the "full logical parity-check matrix," has M·R rows and N·n columns. The quantum circuit 130 (see FIG. 5) implementing the logical parity encoder B (see FIG. 1) may be constructed in the manner described for encoding a single quantum check operator for each row of the matrix $H_Q$: a multiple-qubit gate, which may include the controlled-NOT gate ("CNOT gate") or controlled-PHASE gate ("CPHASE gate") as non-limiting examples, is configured to couple data qubit "j" (illustrated as values $|\psi_j\rangle$ below the logical parity-check matrix 120 in FIG. 4) to ancilla qubit "i" (illustrated as values $|A_i\rangle$ to the right of the logical parity-check matrix 120 in FIG. 4) if, and only if, the binary number located in the i-th row and j-th column of the resultant matrix $R_M$ (which is the logical parity-check matrix or $H_L \otimes H_Q$) is equal to "1."

The construction of the logical parity-check matrix may be iterated by forming the Kronecker product $H_{L1} \otimes H_{L2} \otimes S$ with parity-check matrices $H_{L1}$, $H_{L2}$ and the quantum check operator represented by the variable S.

Logical Parity Decoding Method

Figure 16:
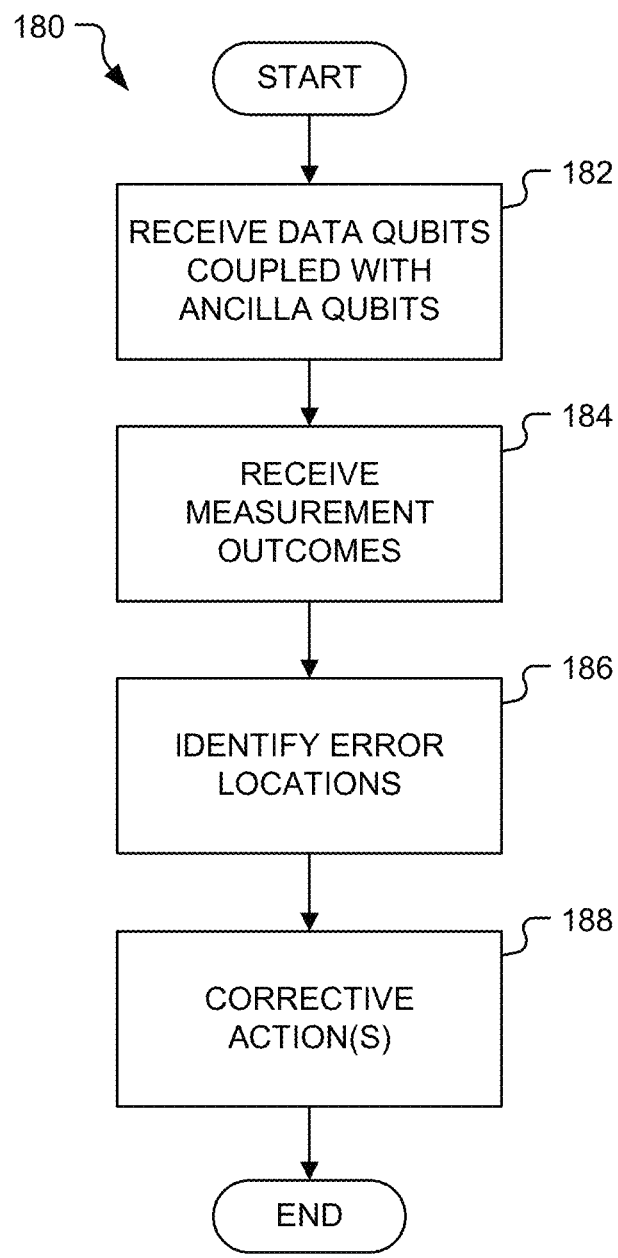
FIG. 16 is a flow diagram of a logical parity decoding method performed by the logical parity decoder of FIG. 1.

FIG. 16 is a flow diagram of the logical parity decoding method 180 performed by the logical parity decoder D (see FIG. 1). The logical parity decoding method 180 uses measurement outcomes obtained (by the measurement apparatus C illustrated in FIG. 1) from the ancilla qubits 106 (see FIGS. 1 and 5) to infer where errors (if any) occurred in the quantum codewords 104 (see FIGS. 1 and 5).

In first block 182, the logical parity decoder D (see FIG. 1) receives the data qubits 102 (see FIG. 1) coupled with the ancilla qubits 106 (see FIG. 1) by the logical parity encoding method 170 (see FIG. 15). As explained above, the logical parity encoding method 170 couples selected ones of the data qubits 102 to one or more of the ancilla qubits 106.

Then, in block 184, the logical parity decoder D (see FIG. 1) receives measurement outcomes (e.g., an array of measurement outcomes) from the measurement apparatus C (see FIG. 1). As described above, the measurement apparatus C generates measurement data by measuring the ancilla qubits 106. The measurement data is communicated to the host processor 166 (see FIG. 17) as the measurement outcomes.

Next, in block 186, the logical parity decoder D (see FIG. 1) uses configuration data and the measurement outcomes to identify a location of an error in the data qubits 102. The configuration data includes the quantum check operator(s) and the binary matrix that were used by the logical parity encoder B (see FIG. 1) to specify which of the ancilla qubits were coupled to which of the data qubits. As mentioned above, in the logical parity encoding method 170 (see FIG. 15), the quantum check operator(s) are based on at least one multiple-qubit Pauli operator and the binary matrix is based at least in part on a classical error correcting code.

In block 188, the logical parity decoder D (see FIG. 1) sends signals to control hardware instructing the control hardware to perform one or more corrective actions on the data qubits. The control hardware may include the hardware on the control and measurement plane 162 (see FIG. 17). By way of non-limiting examples, the control hardware performs the corrective action(s) by using a quantum logic gate to change the state or discarding the state of a data qubit with an error.

As is apparent to those of ordinary skill in the art, the methods 170 and 180 are typically performed after quantum logic gates have been applied to the logical qubits (including the data qubits) in accordance with a quantum algorithm. In other words, the quantum algorithm, which is executed by the quantum computing system 100 (see FIG. 17), is performed using the data qubits. The block 188 may be performed before or after execution of the quantum algorithm completes. When the block 188 is performed after execution of the quantum algorithm completes, the logical parity decoder D (see FIG. 1) waits until execution of the quantum algorithm completes to send the signals to the control hardware. Then, the logical parity decoding method 180 terminates.

In alternate embodiments, in block 186, the logical parity decoder D (see FIG. 1) uses the configuration data and the measurement outcomes to obtain the quantum error syndrome. In such embodiments, the logical parity decoder D passes the quantum error syndrome to the quantum decoder E, which identifies the error location(s). The quantum decoder E may send the error location(s) to the logical parity decoder D, which may then perform block 188. Alternatively, the quantum decoder E may send signals to the control hardware instructing the control hardware to perform the corrective action(s) on the data qubits.

Portions of the logical parity encoding method 170 and the logical parity decoding method 180 may be repeated for different sets of quantum check operator(s). For example, the quantum error correcting code may specify two distinct sets of quantum check operator(s), where each set is used to detect a different error type. For example, a quantum error correcting code may specify one or more quantum check operator(s) for detecting Pauli-X type errors and a distinct set of one or more quantum check operator(s) for detecting Pauli-Z type errors. In such embodiments, the logical parity encoder B and the logical parity encoder D locate errors in the manner described previously by constructing distinct full logical parity syndromes, each corresponding to a specific error type.

For example, the logical parity encoding method 170 and the logical parity decoding method 180 may be performed for quantum check operator(s) for detecting Pauli-X type errors and quantum check operator(s) for detecting Pauli-Z type errors. For ease of illustration, the methods 170 and 180 will be described as being performed for the quantum check operator(s) for detecting Pauli-X type errors before being performed for the quantum check operator(s) for detecting Pauli-Z type errors. However, this order may be reversed, and the methods 170 and 180 may be performed for the quantum check operator(s) for detecting Pauli-Z type errors before being performed for the quantum check operator(s) for detecting Pauli-X type errors.

In this example, the logical parity encoding method 170 and the logical parity decoding method 180 are performed for the quantum check operator(s) for detecting Pauli-X type errors. Then, block 176 (see FIG. 15) is performed for the quantum check operator(s) for detecting Pauli-Z type errors to obtain a second specification. The second specification is generated using the binary matrix and the quantum check operator(s) for detecting Pauli-Z type errors. Then, block 178 (see FIG. 15) is performed for the second specification. Next, in block 182 (see FIG. 16), the logical parity decoder D (see FIG. 1) receives the data qubits 102 (see FIG. 1) coupled with the ancilla qubits 106 (see FIG. 1) in accordance with the second specification. Then, in block 184, the logical parity decoder D (see FIG. 1) receives new measurement outcomes from the measurement apparatus C (see FIG. 1) for the ancilla qubits coupled in accordance with the second specification. In block 186, the logical parity decoder D (see FIG. 1) uses the binary matrix, the quantum check operator(s) for detecting Pauli-Z type errors, and the new measurement outcomes to identify a new location of an error in the data qubits 102. In block 188, the logical parity decoder D (see FIG. 1) sends new signals to the control hardware instructing the control hardware to perform one or more new corrective actions on the data qubits.

FIGS. 6A-8 illustrate an example that shows components of the quantum system 101 of FIG. 1 configured for use with the three-qubit bit-flip quantum code, which may be used to detect and locate a single bit-flip error occurring on any one of the data qubits of a particular quantum codeword.

FIG. 6A illustrates an implementation of the quantum encoder A (see FIG. 1) for the three-qubit bit-flip quantum code that encodes a quantum state $|\psi_1\rangle$ into the quantum codeword $|q\rangle$ using three data qubits. FIGS. 6B and 6C illustrate quantum check operators K1 and K2, respectively, specified by the three-qubit bit-flip quantum code.

Referring to FIGS. 6B and 6C, the quantum decoder E uses each of the quantum check operators K1 and K2 to detect a bit-flip error (in block 186 of FIG. 16) occurring on one of the data qubits of the particular quantum codeword by performing CNOT gates between the data qubits and an ancilla qubit. Each of the quantum check operators K1 and K2 are measured by the measurement apparatus C (see FIG. 1) to obtain measurement outcomes. Coupling a codeword and measuring the quantum error correction check operator are referred to collectively as "syndrome extraction" and performing the syndrome extraction for all quantum check operators of the particular quantum code (for example, the quantum check operators K1 and K2 for the three-qubit code) produces the "quantum error syndrome." The quantum error syndrome is different from the logical parity syndrome.

FIG. 6D illustrates the quantum decoder E (see FIG. 1) for the three-qubit bit-flip quantum code which takes as input the quantum error syndrome and determines the data qubit with the error. In the example of the three-qubit bit-flip quantum code, the quantum decoder E is a simple look-up table 134 with the quantum error syndrome in the left most column and the data qubit with the error in the rightmost column. The look-up table 134 may also include one or more corrective actions to be taken based on the quantum error syndrome. Thus, the look-up table 134 may be used to determine the correction action(s) required based on the quantum error syndrome. Many quantum error correcting codes, notably topological and surface codes, require more sophisticated quantum decoders that are well known to those of ordinary skill in the art and will not be described in detail. However, these quantum decoders may also operate with the logical parity syndrome data provided by the logical parity encoder B (see FIG. 1) and the logical parity decoder D (see FIG. 1).

After the quantum encoder A has formed the quantum codewords and before the quantum decoder E has identified any error locations, the logical parity encoder B uses the quantum check operators K1 and K2 (represented by the variable S) and the binary matrix (represented by the variable H) to couple at least some of the data qubits of the particular quantum codeword to at least one of the ancilla qubits by performing the logical parity encoding method 170 (see FIG. 15). As explained above, the binary matrix (e.g., the parity-check matrix $H_L$, the sub-parity-check matrix $P_L$, the generator matrix GH, and the like) is based at least in part on a classical error correcting code (e.g., a linear parity-check code). Then, before the quantum decoder E uses the quantum error syndrome to identify the data qubit with the error, the logical parity decoder D (see FIG. 1) performs the logical parity decoding method 180 (see FIG. 16). Alternatively, the quantum decoder E may be omitted and, as described in the following example, the logical parity decoder D may be used to determine the error location(s), if any.

Figure 7:
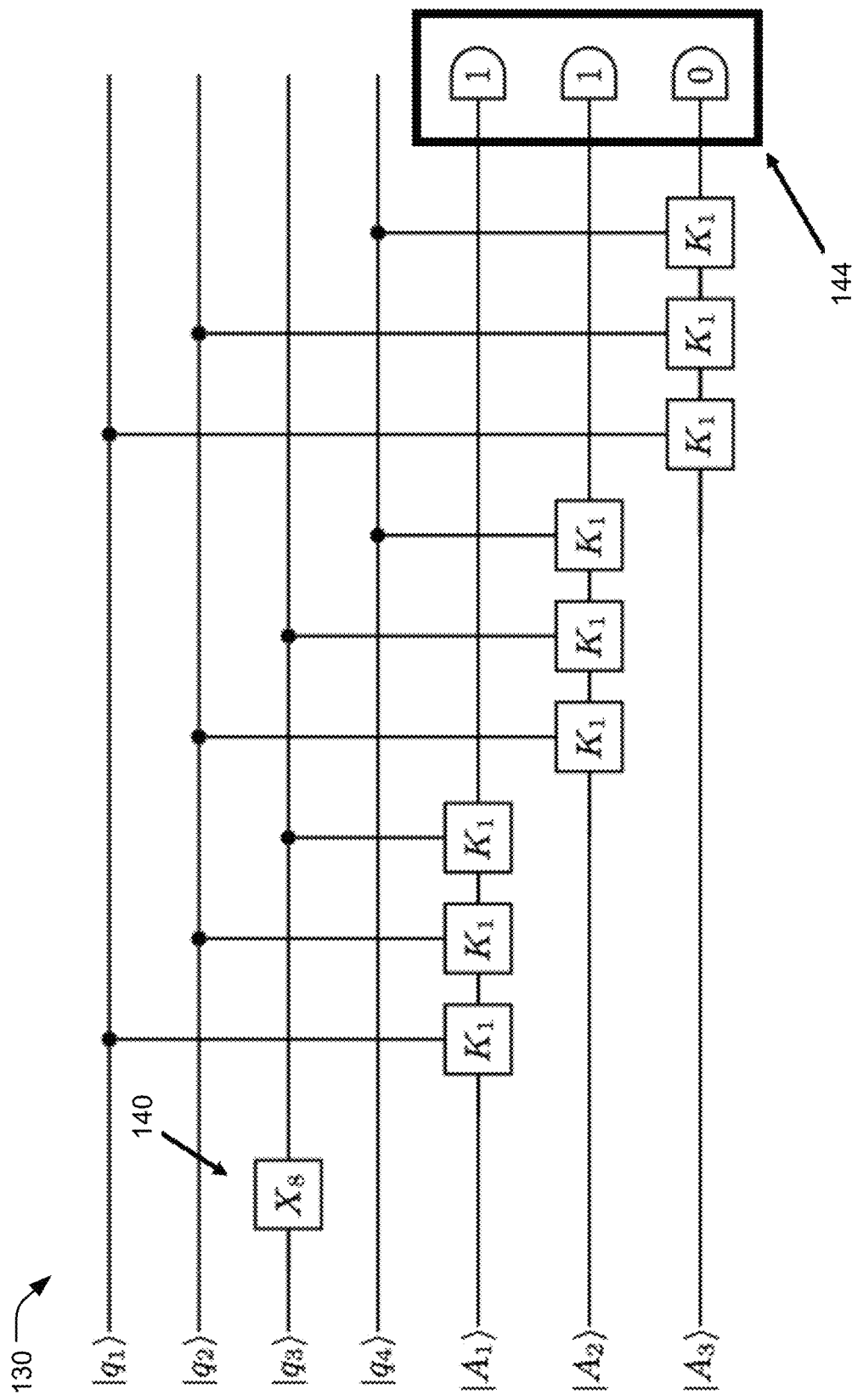
FIG. 7 Illustrates the quantum circuit of FIG. 5 configured to generate a logical parity syndrome measurement for the three-qubit bit-flip quantum code and the quantum check operator K1.

As mentioned above, FIG. 5 illustrates the quantum circuit 130 showing each of its CNOT gates. FIG. 7 also illustrates the quantum circuit 130 configured to measure the quantum check operator K1 (see FIG. 6B) for the three-qubit bit-flip quantum code. In the example illustrated in FIG. 7, there are four three-qubit codewords (labelled $|q_i\rangle$ in FIG. 7) and three ancilla qubits (labelled $|A_i\rangle$ FIG. 7). Suppose a bit-flip error 140 (labelled by "$X_8$" in FIG. 7) occurs on the second data qubit in the codeword $|q_3\rangle$. The logical parity encoding illustrated by the couplings in FIG. 7 corresponds to the binary matrix 122 (see FIG. 4) and the binary representation of the quantum check operator K1 (e.g., given by [1 1 0]) illustrated in FIG. 6B. After completing the logical parity encoding method 170 (see FIG. 15), the measurement apparatus C (see FIG. 1) measures the ancilla qubits in the Z basis to produce a binary array of measurement outcomes (e.g., [1 1 0]), which correspond to a logical parity syndrome 144.

Figure 8:
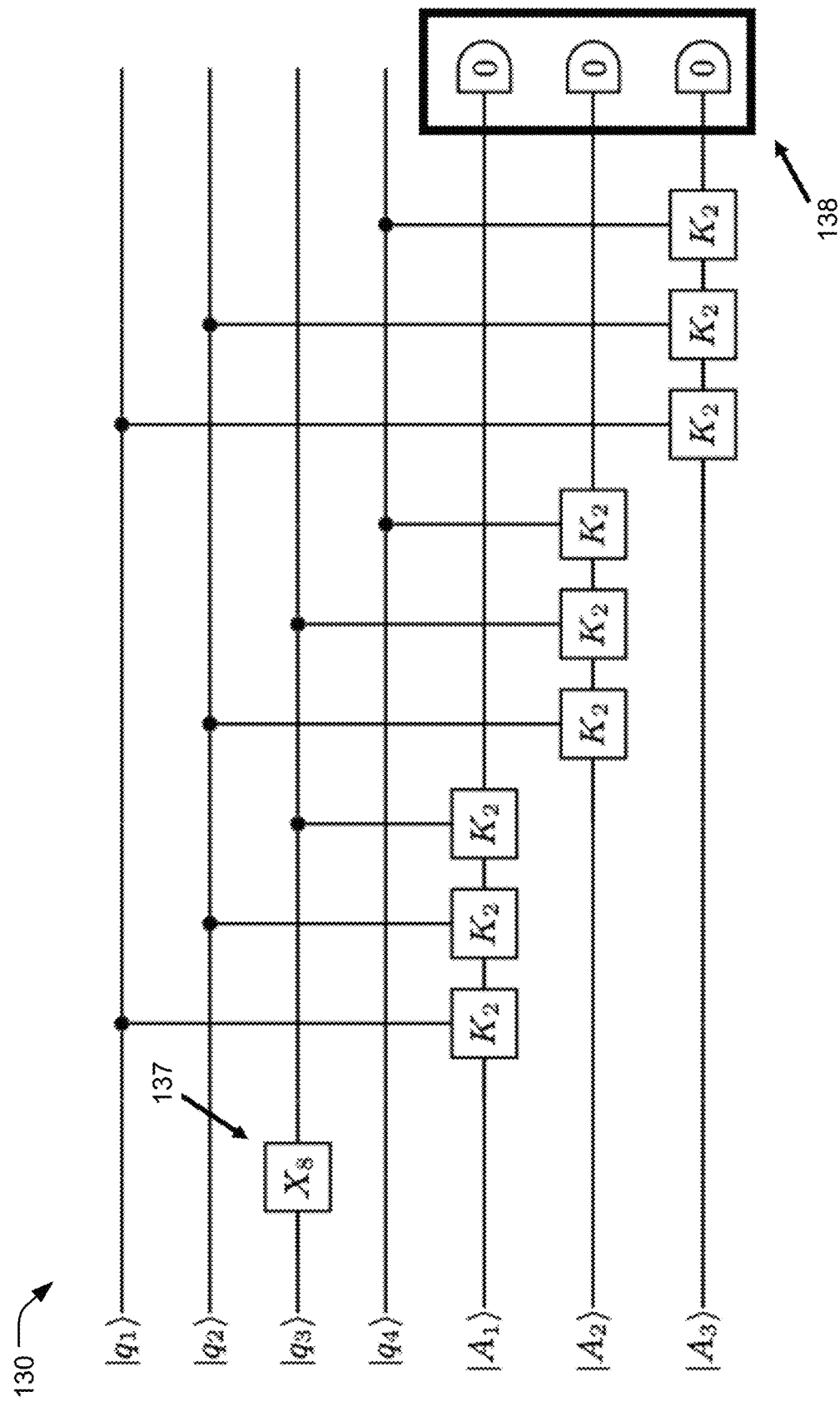
FIG. 8 Illustrates the quantum circuit of FIG. 5 configured to generate a logical parity syndrome measurement for the three-qubit bit-flip quantum code and the quantum check operator K2.

To complete the syndrome extraction using the logical parity decoder D (see FIG. 1) to determine the "full logical parity syndrome" for the three-qubit bit-flip quantum code, the quantum check operator K2 (see FIG. 6C) must be measured by coupling the four three-qubit codewords to the ancilla qubits according to the specification and measuring the ancilla qubits with the measurement apparatus C (see FIG. 1). FIG. 8 illustrates the quantum circuit 130 configured to encode and measure the quantum check operator K2 using the example parity-check code shown in the binary matrix 122 of FIG. 4. The logical parity encoding illustrated by the couplings in FIG. 8 corresponds to a binary matrix 122 (see FIG. 4) and the binary representation of the quantum check operator K2 (e.g., given by [1 0 1] and illustrated in FIG. 6C). Referring to FIG. 8, in this example a bit-flip error 137 is present on the second data qubit of the codeword $|q_3\rangle$ as illustrated by "$X_8$" in FIG. 8. The quantum check operator K2 does not couple the second data qubit of the three-qubit bit-flip quantum code to the ancilla qubit (see FIG. 6C). Thus, after the logical parity encoding and measurement, the logical parity syndrome 138 (e.g., [0 0 0]) is produced by the measurement apparatus C (see FIG. 1).

Figure 9:
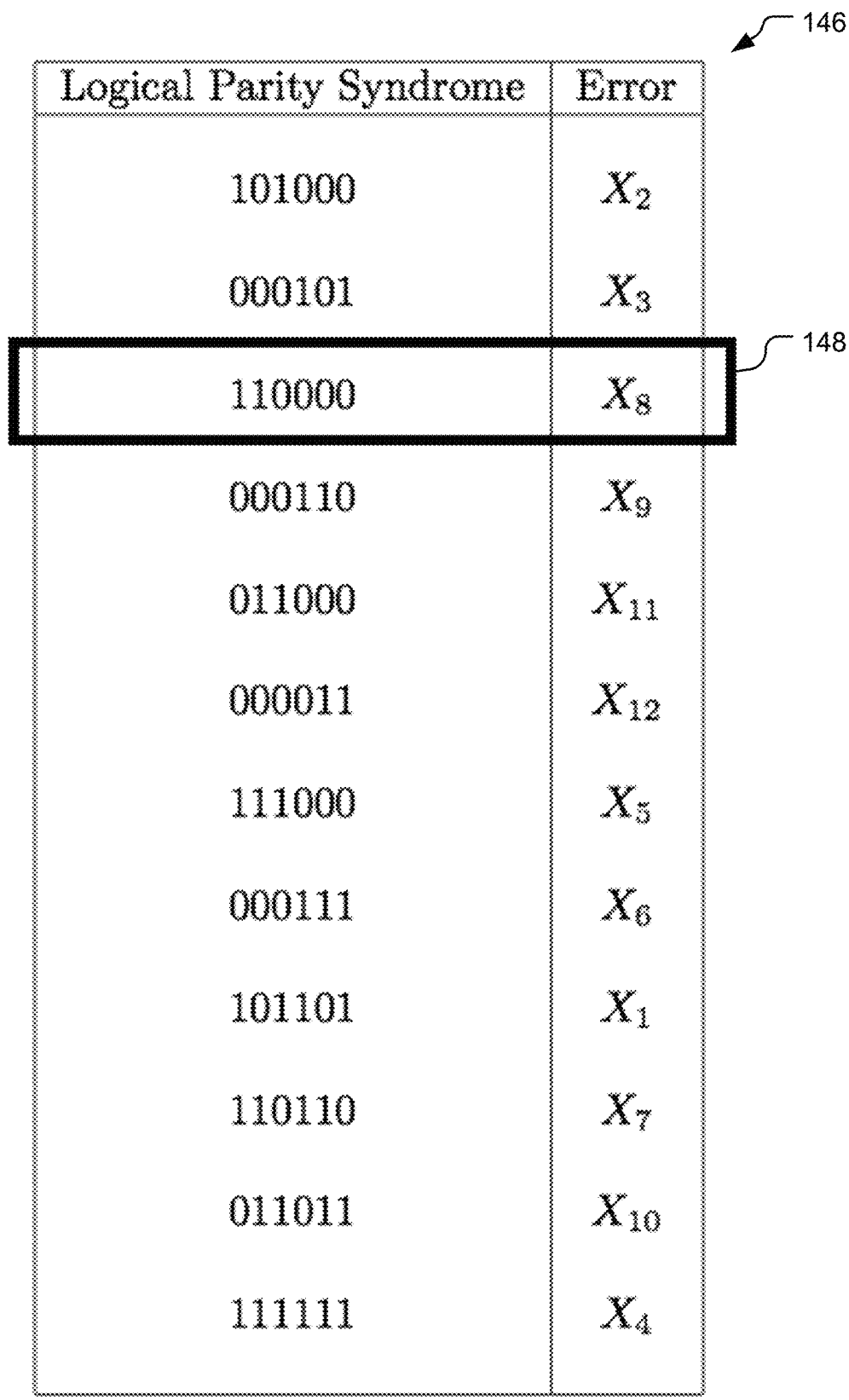
FIG. 9 Illustrates a syndrome look-up table mapping logical parity syndromes to error patterns for the example illustrated in FIGS. 6, 7, and 8.

Referring to FIG. 9, the logical parity decoder D (see FIG. 1) may include a pre-computed look-up table 146 that maps full logical parity syndromes to error patterns. The parity-check matrix $H_L$ corresponds to an error correcting code with the following dimensions [N, K, t]. The look-up table 146 used by the logical parity decoder D may be constructed as follows: all error patterns containing a number of errors less than or equal to a threshold number "t" can be generated and represented by a binary rectangular array (e.g., the binary rectangular array 116 illustrated in FIG. 3). The variable "E" denotes a binary representation of an error pattern with less than or equal to the threshold number "t" of errors. The logical parity syndrome corresponding to an error pattern E with a logical parity-check matrix $H_L \otimes S$ may be pre-computed by performing the modulo-2 matrix multiplication $SEH_L^T$ using the vector corresponding to a quantum check operator (represented by variable S), the error pattern E, and the transpose of parity-check matrix $H_L^T$. These computations can be performed on a conventional computing device (e.g., the host processor 166 illustrated in FIG. 17) for all error patterns with less than the threshold number "t" of errors and each quantum check operator to generate the full logical parity syndrome and then stored as the look-up table 146 for use by the logical parity decoder D (see FIG. 1). Referring to FIG. 1, during operation of the logical parity encoder B and the logical parity decoder D, the error pattern may be uniquely identified by querying the lookup table 146 (see FIG. 9) with the full logical parity syndrome (computed by the measurement apparatus C) and returning the corresponding error pattern to the action component F, which implements the corrective action(s) on the data qubits.

The exemplary look-up table 146 illustrated in FIG. 9 was prepared for the example three-qubit bit-flip code illustrated in FIGS. 6A-8 and the binary matrix 122 (see FIG. 4). In the example, the full logical parity syndrome is constructed by joining the logical parity syndromes measured by the quantum circuits illustrated in FIGS. 7 and 8 (e.g., concatenating them). Referring to FIGS. 7 and 8, the bit-flip error 140 (see FIG. 7) produces the logical parity syndrome 144 (e.g., [1 1 0]) and the bit-flip error 137 (see FIG. 8) produces the logical parity syndrome 138 (e.g., [0 0 0]) (see FIG. 8). The full logical parity syndrome is formed by joining (e.g., concatenating) the logical parity syndromes for each quantum check operator. In the example illustrated in FIGS. 7 and 8, the full logical parity syndrome is formed by concatenating the logical parity syndrome 144 (e.g., [1 1 0]) and the logical parity syndrome 138 (e.g., [0 0 0]) to obtain the full logical parity syndrome (e.g., [1 1 0 0 0 0]). Referring to FIG. 9, all single qubit errors on the data qubits, $X_1$, $X_2$, . . . $X_{12}$ (right column) correspond to a unique full logical parity syndrome (left column) that can be used as a look-up table during the operation of the logical parity decoder D (see FIG. 1). For the example illustrated in FIGS. 6A-8, the logical parity syndrome corresponding to the bit-flip error 140 (see FIG. 7) and the bit-flip error 137 (see FIG. 8) is illustrated by a record 148 (see FIG. 9) in the lookup table.

Referring to FIG. 1, faulty multiple-qubit gates used during encoding and errors occurring in the measurement apparatus C may introduce errors in the measured logical parity syndrome. The logical parity encoder B and the logical parity decoder D may be configured to correct for errors in the logical parity syndrome and then uniquely identify error patterns acting on the data qubits. In this mode of operation, the logical parity encoder B may be specified by the sub-parity-check matrix $P_L$ corresponding to a classical code with parameters [N,K, t] with the parity-check matrix $H_L$, which may be expressed in a systematic form $H_L$=[I $P_L$]. The logical parity decoder D may be configured with a syndrome look-up table mapping correctable error patterns in the data qubits to measurement outcomes in the manner described previously but using the sub-parity-check matrix $P_L$ and the quantum check operator(s) to pre-compute the logical parity syndromes. A measurement error or faulty quantum check operator may lead to a logical parity syndrome that is not present in the pre-computed syndromes contained in the look-up table. When a measurement outcome is not in the look-up table, the logical parity decoder D may query the syndrome look-up table for the logical parity syndrome nearest to the measurement outcome and return the corresponding error pattern to the quantum decoder E or directly to the action component F. The logical parity decoder D may implement the search for the nearest logical parity syndrome by computing the Hamming distance between the measurement outcomes and the logical parity syndromes stored in the look-up table. When the logical parity encoder B is configured with a [N,K t] classical code, the logical parity decoder D may detect and locate at least the threshold number "t" of errors occurring in the data qubits or measurement outcomes combined. The logical parity decoder D may also implement a maximum likelihood estimate of the logical parity syndrome from the measurement outcomes using probabilistic inference and a probabilistic model of the error processes.

The logical parity decoder D may be implemented by a neural belief decoder using one or more of the methods described in references [3] and [4]. The neural belief decoder may be constructed using measurement outcomes and the configuration data that may include logical parity-check matrices $H_L \otimes S$ for all of the quantum check operators ($S_1$, $S_2$, . . . , $S_R$).

As known to those of ordinary skill in the art, to ensure fault tolerance, where errors present in the ancilla qubits only propagate to a single data qubit during measurement of a quantum check operator, each ancilla qubit may be replaced by a block of ancilla qubits prepared in an entangled state and measured by one or more of the methods described in references [5, 6, 7]. The logical parity encoder B (see FIG. 1) and the logical parity decoder D (see FIG. 1.) may be configured to use multiple-qubit ancilla to implement fault-tolerant syndrome extraction. In this configuration, each ancilla qubit (denoted by a single line or "wire" in FIGS. 1, 7, and 8) is replaced with an ancilla block using multiple ancilla qubits that may be prepared in an entangled state, as described in references [5, 6, 7] as non-limiting examples. The logical parity encoder B constructs a quantum circuit by coupling the data qubits to the ancilla blocks according to the logical parity-check matrix $H_L \otimes S$ constructed from the parity-check matrix $H_L$ and the binary vector (represented by the variable S) corresponding to the quantum check operator. In this configuration, the logical parity encoder B, couples each of the data qubits $|\psi_j\rangle$ to an ancilla block $|A_i\rangle$, if and only if, the number in the i-th row and j-column of $H_L \otimes S$ has the value "1." The coupling of a data qubit to an ancilla block may be implemented by performing a separate multiple-qubit gate, including the CNOT or CPHASE gate as non-limiting examples, between a data qubit and an ancilla qubit in the ancilla block as prescribed by the quantum check operator represented by the binary vector (represented by the variable S).

Figure 10:
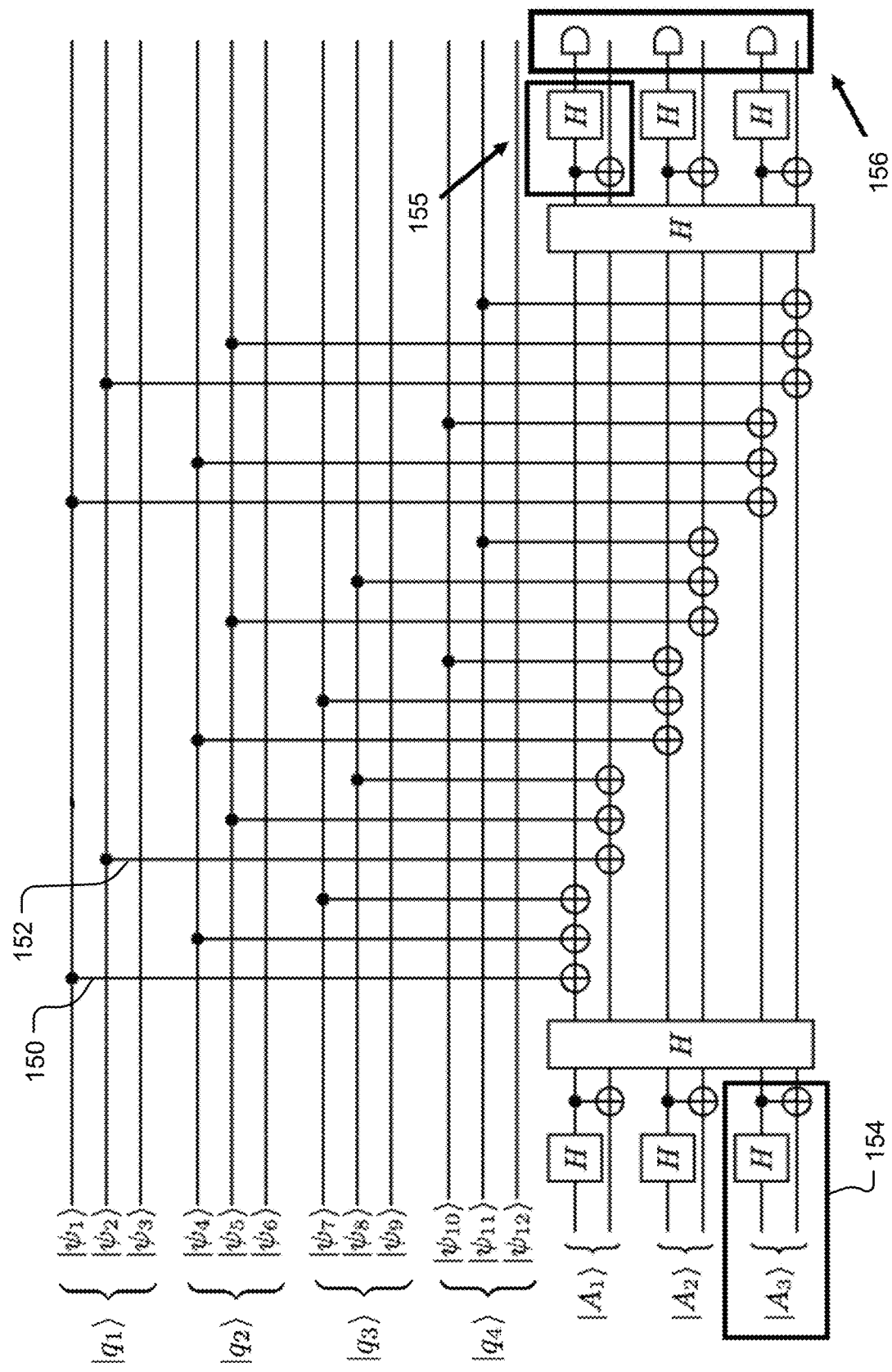
FIG. 10 illustrates a quantum circuit coupling, in a fault-tolerant manner, quantum codewords to blocks of ancilla qubits prepared in an example entangled state.

FIG. 10 illustrates a quantum circuit implemented by the logical parity encoder B (see FIG. 1) and configured to use entangled ancilla blocks for measurement of the binary matrix 122 (see FIG. 4) and the quantum check operator represented by the variable S (e.g., [1 1 0] in FIG. 10). Referring to FIG. 10, each ancilla block, denoted $|A_i\rangle$ for i=1,2,3 may be prepared in a two-qubit entangled state, illustrated inside a rectangle 154, by implementing CNOT gates and a Hadamard gate (depicted as a box containing the capital letter "H"). To ensure fault-tolerant encoding and measurement with an entangled ancilla block, the logical parity encoder B (see FIG. 1) couples data qubits to ancilla blocks but in the manner described previously with the modification that each data qubit in a quantum codeword is coupled to a separate ancilla qubit in the ancilla block. For example, the logical parity-check matrix formed by the binary matrix 122 and the binary representation of the quantum check operator K1 (see FIG. 6B) specifies that data qubits $|\psi_1\rangle$ and $|\psi_2\rangle$ (contained in the quantum codeword N0) are coupled to ancilla block $|A_1\rangle$. In this example, the fault-tolerant logical parity encoding is illustrated by vertical lines 150 and 152 where data qubits 100 and $|\psi_2\rangle$ are coupled via CNOT gates to separate ancilla qubits in the ancilla block $|A_1\rangle$. Note that in contrast to conventional fault-tolerant quantum error correction and syndrome extraction, data qubits from multiple quantum codewords are coupled to each ancilla block. For example, quantum codewords $|q_1\rangle$, $|q_2\rangle$, $|q_3\rangle$ are coupled to ancilla block $|A_1\rangle$ as prescribed by the first row of the binary matrix 122 (see FIG. 4). The entire quantum circuit illustrated in FIG. 10 may couple all the selected data qubits to one or more ancilla blocks in this manner and as specified by the logical parity-check matrix. As illustrated in FIG. 10, the logical parity syndrome is obtained through measurement 156 of each ancilla block after decoding the ancilla preparation illustrated by a rectangle 155.

Figure 11:
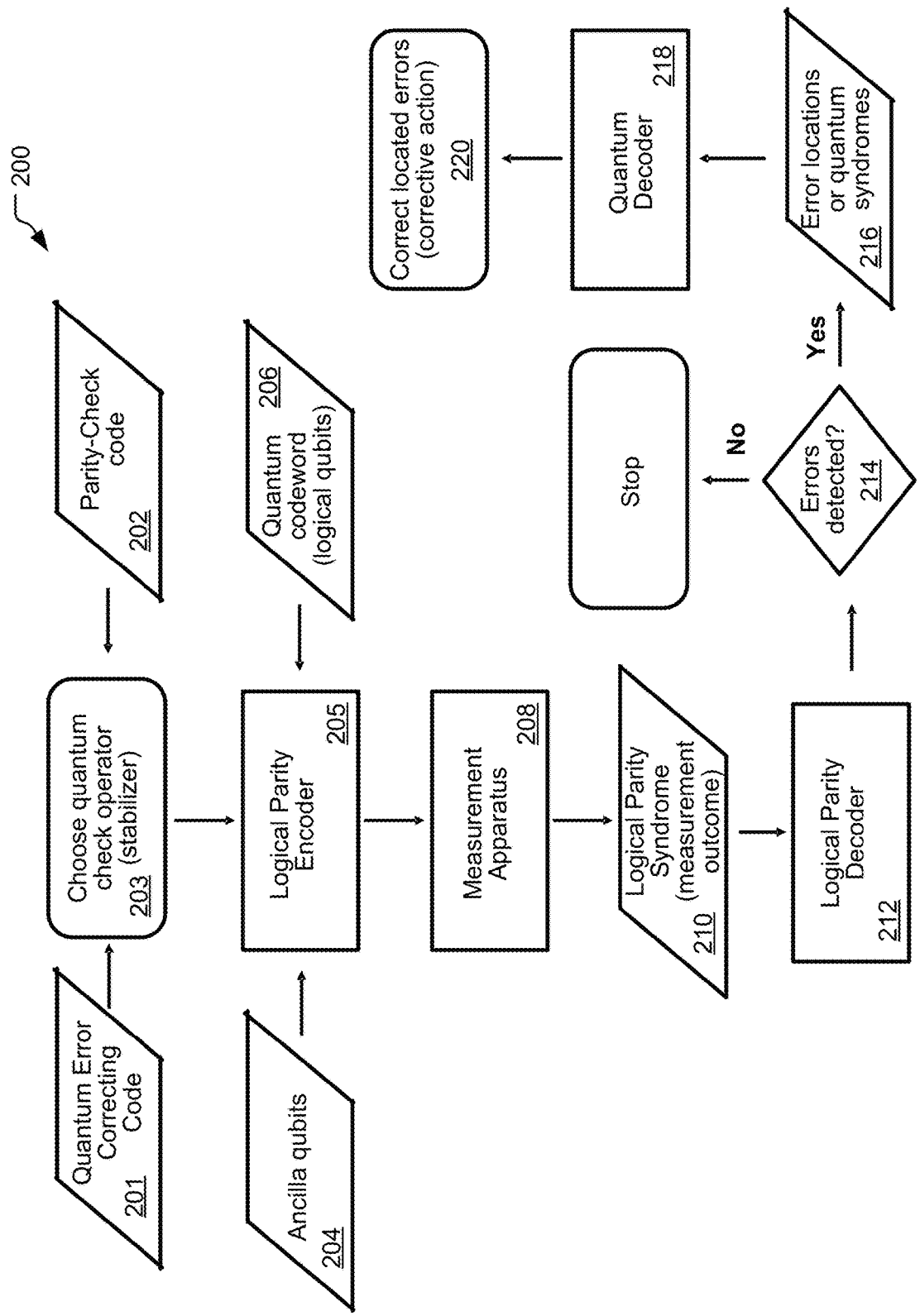
FIG. 11 Illustrates a process diagram of a method of performing quantum error detection, location, and correction that is performed at least in part by the logical parity encoder and the logical parity decoder.

FIG. 11 illustrates a process diagram of a method 200 performed by the logical parity encoder B (see FIG. 1) and the logical parity decoder D (see FIG. 1). The method 200 is configured to perform quantum error detection, location, and correction as described in detail in the previous paragraphs. Prior to operation, the method 200 requires as input (1) a quantum error correcting code 201 chosen for a particular application and quantum architecture and (2) a classical [N,K,t] parity-check code 202 chosen such that the number "N" of quantum codewords and the number "t" of detectable errors in the data qubits meet the requirements of the chosen application and architecture. As described in the previous paragraphs, the [N,K,t] parity-check code 202 may alternatively be used in the logical parity encoder to encode a number "K" of quantum codewords to detect and correct a total number "t" of detectable errors occurring in the data qubits or measurement and coupling errors by using the sub-parity-check matrix $P_L$ of the parity-check matrix $H_L$.

Associated with the chosen quantum error correcting code 201 there are a number of quantum check operators or stabilizers. In block 203, the computing device implementing the logical parity encoder B (see FIG. 1) forms the logical parity-check matrix according to Equation 1 for the variable S representing a chosen stabilizer of the quantum error correcting code 201 and the binary matrix (represented by the variable H). In this embodiment, the binary matrix may be the parity-check matrix $H_L$ corresponding to the chosen parity-check code 202 or the sub-parity-check matrix $P_L$.

The term "ancilla factory" is used to describe a quantum system used to prepare ancilla qubits either as single qubits or as multiple-qubit entangled states for use in quantum error correction or other processes during operation of the quantum computer. An ancilla factory (not shown) prepares a number of ancilla qubits 204 either as single qubits or as multiple-qubit entangled states as described in the previous paragraphs for fault-tolerant operations. The ancilla factory (not shown) provides the ancilla qubits 204 to the logical parity encoder B (see FIG. 1) and/or the quantum computer (not shown).

In block 205, the logical parity encoder B (see FIG. 1) directs the quantum computer to couple quantum codewords 206 to ancilla qubits 204 in the manner described previously and according the resultant matrix $R_M$ described by Equation 1.

In block 208, the ancilla qubits 204 are measured by the quantum measurement apparatus C (see FIG. 1) to produce the binary valued logical parity syndrome. Blocks 205 and 208 are then repeated for each stabilizer chosen by the computing device (in block 203) until all of the stabilizers associated with the quantum error correcting code 201 have been encoded and measured to produce the full logical parity syndrome 210. In block 212, the measurement apparatus C (see FIG. 1) provides the full logical parity syndrome 210 to the logical parity decoder D (see FIG. 1) and the logical parity decoder D determines the type and location of any errors 316 present.

In decision block 214, the computing device implementing the logical parity decoder D (see FIG. 1) determines whether an error is present from the full logical parity syndrome 210. If the full logical parity syndrome 210 is all zeros, the logical parity decoder D (see FIG. 1) determines, in decision block 214, that there are no errors in the quantum codewords 206 and the method 200 stops. When the method 200 stops, the quantum codewords 206 are returned to the computing device governing the execution of the quantum algorithm. If, on the other hand, the full logical parity syndrome 210 is non-zero, the logical parity decoder D determines, in decision block 214, that one or more errors are present in the quantum codewords 206. When the decision in decision block 214 is "YES," in block 216, the computing device governing the logical parity decoder D (see FIG. 1) performs the logical parity decoding method 180 (see FIG. 16) to determine the error locations. Alternatively, the logical parity decoder D may reconstruct the quantum syndrome for each quantum codeword from the full logical parity syndrome 210. In this case, in block 218, the computing device implementing the quantum decoder E (see FIG. 1) may use the quantum syndromes to determine the error locations. Finally, in block 220, the error locations are passed to the control hardware implementing the corrective actions to correct one or more errors in the data qubits of the quantum codewords 206. Then, the method 200 terminates.

Referring to FIG. 1, the logical parity encoder B and the logical parity decoder D may be applied to any process that uses error correcting codes as a computational primitive. Quantum state distillation is one such application, where several noisy copies of the quantum resource state are distilled into higher fidelity states by measuring the quantum check operators (stabilizers) of a quantum error correcting code. By way of non-limiting examples, the methods described in references [8, 9, 10] may be employed for state distillation using quantum error correcting codes. In contrast to quantum error correction, however, in quantum state distillation quantum states are discarded if one or more errors are detected. Thus, in embodiments implementing quantum state distillation, the corrective action performed by the action component F is to discard the set of states that contain an error as detected and located by the logical parity encoder B and the logical parity decoder D. Using a [N,K,t] parity-check code specified by the parity-check matrix $H_L$, and a quantum error correcting code using n data qubits for each quantum codeword, the logical parity encoder B and the logical parity decoder D may be used to detect and locate errors in N·n noisy resource states simultaneously. To complete the state-distillation process, states with no errors, as determined by the logical parity decoder D, are joined by an unencoding procedure to produce a higher fidelity resource state as described in references [8, 9, 10].

Figure 12:
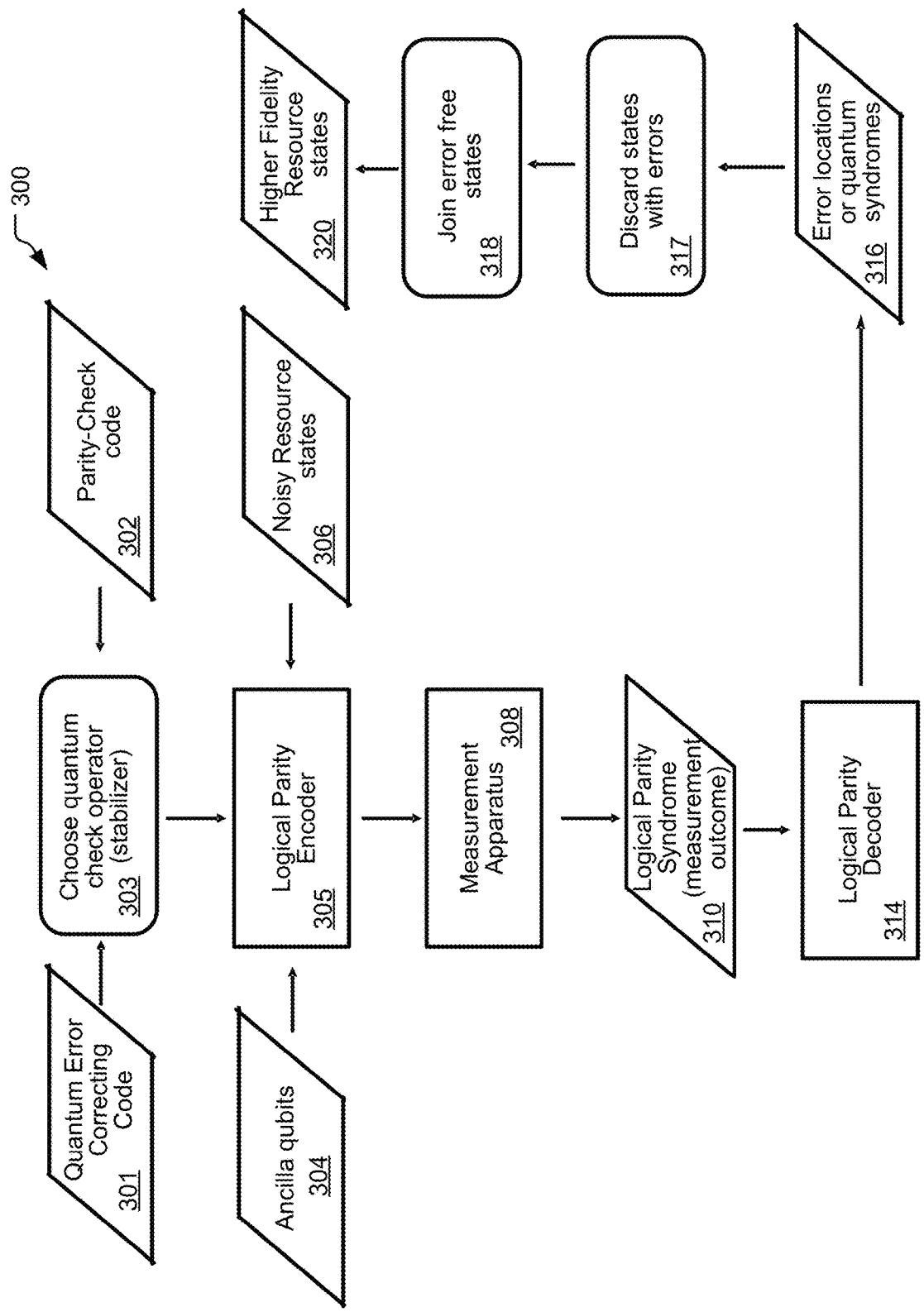
FIG. 12 Illustrates a process diagram of a method of quantum state distillation performed at least in part by the logical parity encoder and the logical parity decoder.

FIG. 12 illustrates a process diagram of a method 300 performed by the logical parity encoder B (see FIG. 1) and the logical parity decoder D (see FIG. 1). The method 300 is configured to perform quantum state distillation as described in the previous paragraph. Prior to operation, the method 300 requires as input a quantum error correcting code 301 chosen to distill the desired quantum resource state that may include, as non-limiting examples, the |T> or the |HAD> quantum states as known to those of ordinary skill in the art. Let the quantum error correcting code 301 use a number "n" of data qubits for each quantum codeword. A classical [N,K,t] parity-check code 302 must be chosen such that the number "N" of qubits and number "t" of detectable errors in the data qubits meet the requirements of the chosen application and architecture.

In block 303, the computing device implementing the logical parity encoder B (see FIG. 1) forms the logical parity-check matrix according to Equation 1 for the variable S representing a chosen stabilizer of the quantum error correcting code 301 and the variable H representing a parity-check matrix corresponding to the chosen parity-check code 302.

An ancilla factory (not shown) prepares a number of ancilla qubits 304 either as single qubits or as multiple-qubit entangled states as described in the previous paragraphs for fault-tolerant operations. The ancilla factory (not shown) provides the ancilla qubits 304 to the logical parity encoder B (see FIG. 1) and/or the quantum computer (not shown).

A number of N·n noisy resource states 306 are prepared by a quantum computer or as output of a previous round of quantum state distillation. The noisy resource states 306 are provided to the logical parity encoder B (see FIG. 1).

In block 305, the logical parity encoder B (see FIG. 1) directs the quantum computer to couple the N·n resource states 306 to the ancilla qubits 304 in the manner described previously and according the resultant matrix $R_M$ described by Equation 1.

In block 308, the ancilla qubits 304 are measured by the quantum measurement apparatus C (see FIG. 1) to produce the binary valued logical parity syndrome. Blocks 305 and 308 are repeated for each stabilizer chosen by the computing device (in block 303) until all of the stabilizers associated with the quantum error correcting code 301 have been measured to produce the full logical parity syndrome 310. The measurement apparatus C (see FIG. 1) provides the full logical parity syndrome 210 to the logical parity decoder D (see FIG. 1).

In block 314, the computing device implementing the logical parity decoder D (see FIG. 1) determines the type and location of any errors 316 present in the resource states from the full logical parity syndrome 310. In block 317, the action component F (see FIG. 1), implemented by the control hardware of the quantum computer, discards any resource state containing an error as determined by the logical parity decoder D (see FIG. 1). Finally, in block 318, the error free states are joined to produce higher fidelity resource states 320 with the methods described in references [8,9,10] as non-limiting examples. Then, the method 300 terminates.

As known to those of ordinary skill in the art, multiple-qubit entangled states, which may include "cat," "GHZ", "cluster," and quantum codewords as non-limiting examples, may be used as ancilla blocks for fault-tolerant syndrome measurement, measurement based quantum computing, or as quantum codewords as non-limiting examples. These entangled states may be verified to be error free before being used by other processes in the quantum computer. The logical parity encoder B and the logical parity decoder D may be used to implement an ancilla factory configured to prepare an error free target multiple-qubit entangled state. As known to those of ordinary skill in the art, multiple-qubit entangled states may be verified to be error free by specifying a verification circuit that couples the multiple-qubit entangled states to additional ancilla qubits that are then measured to signal errors. In this configuration, the logical parity encoder B (see FIG. 1) is specified by a parity-check matrix of a classical error correcting code and a quantum check operator implementing the verification circuit of the entangled state. Using a [N,K,t] parity-check code, the logical parity encoder B and the logical parity decoder D may be used to verify and locate errors in the preparation of N entangled states simultaneously. Referring to FIG. 1, in the embodiment of state preparation and verification, the quantum encoder A prepares the multiple-qubit entangled state and the action component F discards multiple-qubit entangled states that contain errors as determined by the logical parity decoder D.

Figure 13:
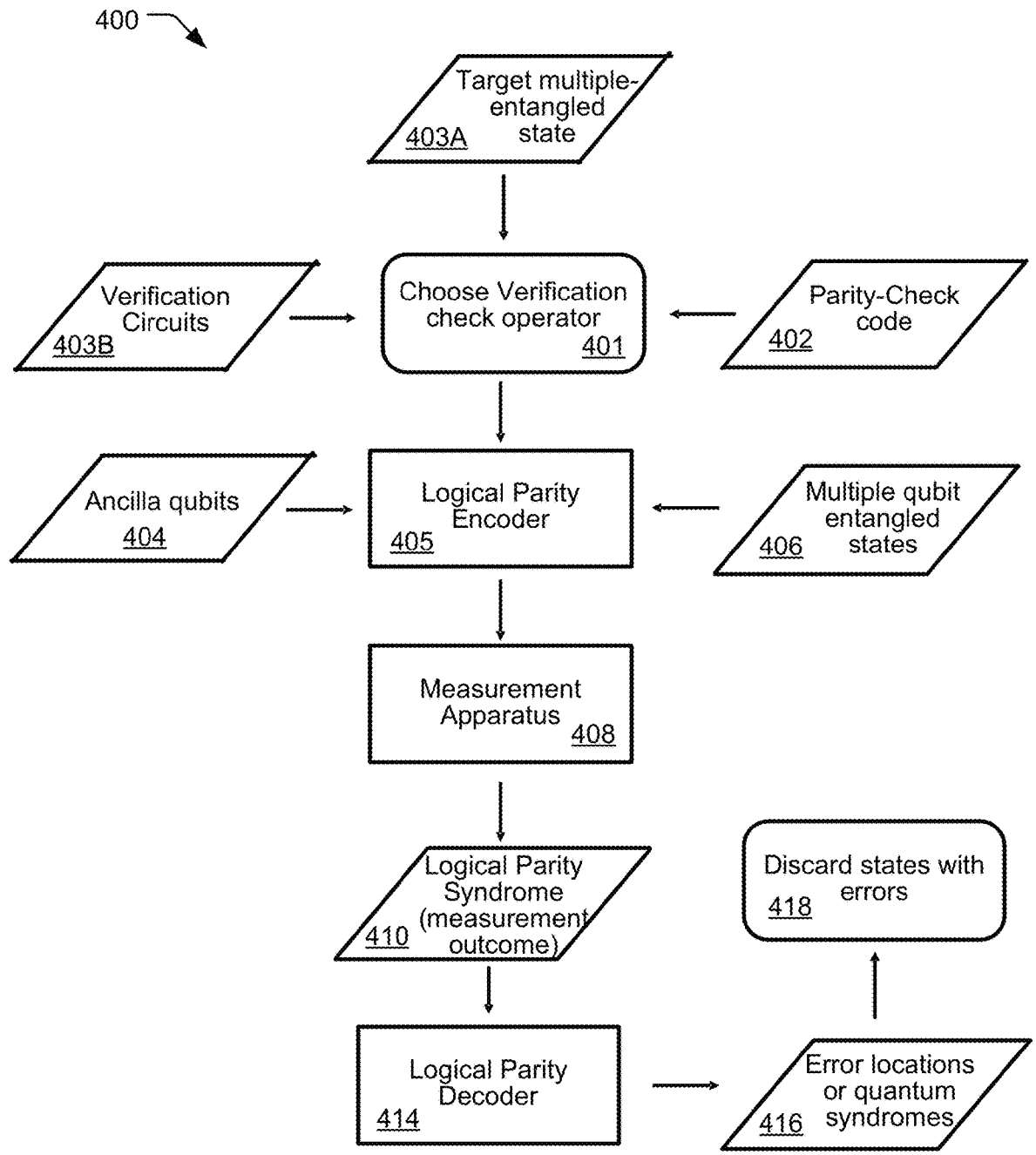
FIG. 13 Illustrates a process diagram of a method of preparing and verifying multiple-qubit entangled states performed at least in part by the logical parity encoder and the logical parity decoder.

FIG. 13 illustrates a process diagram of a method 400 implemented by the logical parity encoder B (see FIG. 1) and the logical parity decoder D (see FIG. 1). The method 400 may be used to prepare and verify multiple-qubit entangled states. Prior to operation, the method 400 requires as input a target multiple-entangled state 403A using a number "n" qubits, a corresponding set of verification circuits 403B used to determine if the states are error free, and a classical [N,K,t] parity-check code 402. The classical [N,K,t] parity-check code 402 must be chosen such that the number "N" of multiple-qubit entangled states and number "t" of detectable errors in the data qubits meets the requirements of the chosen application and architecture.

In block 401, the computing device governing the logical parity encoder B (see FIG. 1) chooses a verification circuit from the set of verification circuits 403B. The chosen verification circuit may be expressed as a binary vector and forms the logical parity-check matrix according to Equation 1. In other words, the variable S of the Equation 1 represents the verification circuit expressed as a binary vector.

The number "N" multiple-qubit entangled states 406 are prepared by a quantum computer. In block 405, the logical parity encoder directs the quantum computer to couple the multiple-qubit entangled states 406 to ancilla qubits 404 403 in the manner described previously and according the resultant matrix $R_M$ described by Equation 1.

In block 408, the ancilla qubits 404 are measured by the quantum measurement apparatus C (see FIG. 1) to produce the binary valued logical parity syndrome. Blocks 405 and 408 are repeated for each verification circuit chosen by the computing device (in block 401) until all of the verification circuits 403B required to verify the target multiple-qubit entangled state 403A have been measured to produce the full logical parity syndrome 410.

In block 414, the computing device implementing the logical parity decoder D (see FIG. 1) determines the type and location of any errors 416 present in the multiple-qubit entangled states from the full logical parity syndrome 410. In block 418, the action component F (see FIG. 1), implemented by the control hardware of the quantum computer, discards any multiple-qubit entangled state containing an error as determined by the logical parity decoder D. Then, the method 400 terminates.

The logical parity encoder B (see FIG. 1) may be configured with a logical parity matrix formed by the parity-check matrix $H_L$, the quantum check operator (represented by a variable S) and additional binary matrices $G_1$ and $G_2$. In such embodiments, the logical parity matrix (or the resultant matrix $R_M$) may be formed in accordance with an Equation 4 below:

$$G_1 \cdot H_L \otimes G_2 \cdot S \qquad \text{Equation 4}$$

In Equation 4, the matrix multiplication $G_1 \cdot H_L$ and $G_1 \cdot S$ is performed modulo-2.

In the case of a number "R" of quantum check operators $(S_1, S_2, \ldots, S_R)$, the logical parity encoder B may be configured with a logical parity matrix parity-check formed by the parity-check matrix $H_L$, the binary matrix $H_Q$ defined in Eq. 2 and additional binary matrices $G_1$ and $G_2$ described by the Equation 5 below:

$$G_1 \cdot H_L \otimes G_2 \cdot H_Q \qquad \text{Equation 5}$$

In this configuration, the binary matrices $G_1$ and $G_2$ may be chosen as generator matrices of binary linear error correcting codes with appropriate dimensions so that Equation 4 or Equation 5 is well defined. The binary matrices $G_1$ or $G_2$ may also be chosen to be an identify matrix. In this embodiment, the logical parity encoder B and the logical parity decoder D (see FIG. 1) may detect, locate, and correct errors occurring during the coupling procedure or from measurement errors, in addition to the errors occurring in the data qubits.

The logical parity encoder B (see FIG. 1) couples data qubits to ancilla qubits according to the logical parity-check matrix described by Equation 3 or Equation 4 in the manner described above: data qubit "j" is coupled to ancilla qubit "i" if, and only if, the binary number located in the i-th row and j-th column of the logical parity-check matrix given by Equation 3 is "1." On the other hand, if the binary number located in the i-th row and j-th column of the logical parity-check described by Equation 4 or Equation 5 is "0," the data qubit "j" remains uncoupled from the ancilla qubit "i." This configuration may also be encoded in the fault-tolerant manner using entangled ancilla blocks as described previously.

The logical parity decoder D (see FIG. 1) may be configured to operate with a logical parity-check matrix described by Equation 4 or Equation 4. In this embodiment, the logical parity decoder may be implemented as a look-up table as described above or by using any method for decoding classical product codes constructed from the generator matrices $G_1$ and $G_2$. Decoding methods for classical error correcting codes arranged as product codes are well known to those of ordinary skill in the art.

Figure 14:
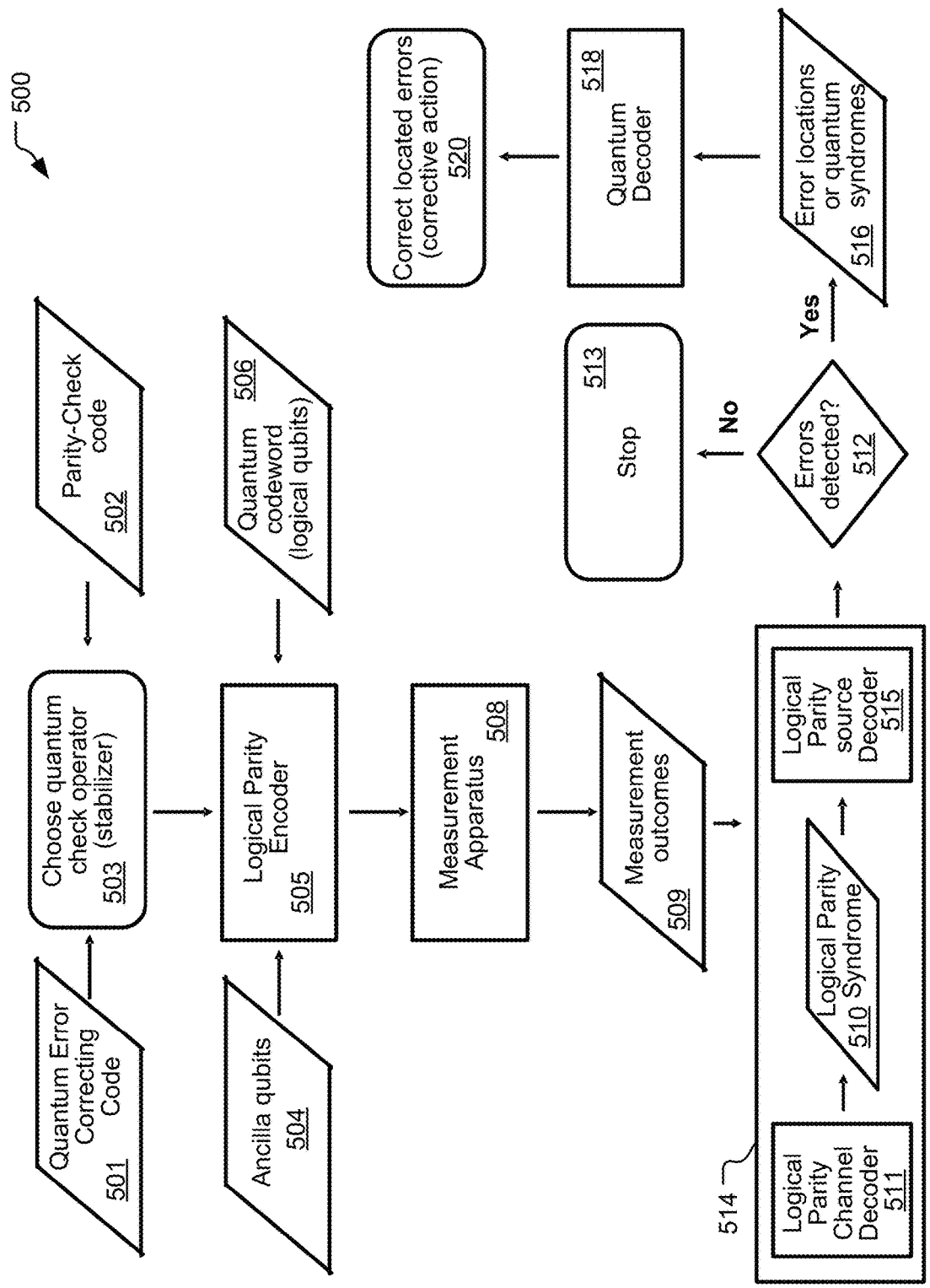
FIG. 14 illustrates a process diagram of a method of performing quantum error detection, location, and correction using additional classical codes to detect and correct errors occurring in the measurement or coupling process performed at least in part by the logical parity encoder and the logical parity decoder.

FIG. 14 illustrates a process diagram of a method 500 performed by the logical parity encoder B (see FIG. 1) and the logical parity decoder D (see FIG. 1). The method 500 uses generator matrices $G_1$ and $G_2$ and logical parity-check matrix described by Equation 4 to perform quantum error detection, location, and correction. The method 500 uses additional classical linear error correcting codes to detect and correct errors occurring in the measurement or coupling process. Prior to operation, the method 500 requires as input a quantum error correcting code 501 chosen for a given application and quantum architecture, and a classical [N,K,t] parity-check code 502 chosen such that the number "N" of quantum codewords and the number "t" of detectable errors in the data qubits meets the requirements of the chosen application and architecture. In addition, classical error correcting codes with generator matrices $G_1$ and $G_2$ are chosen of appropriate length.

In block 503, the computing device governing the logical parity encoder B (see FIG. 1) forms the logical parity-check matrix $H_L$ and the generator matrices $G_1$ and $G_2$ according to Equation 4 above for a chosen stabilizer of the quantum error correcting code 501 and the binary matrices $H_1$, $G_1$ and $G_2$.

An ancilla factory (not shown) prepares a number of ancilla qubits 504 either as single qubits or as multiple-qubit entangled states as described in the previous paragraphs for fault-tolerant operations. In block 505, the logical parity encoder B (see FIG. 1) directs the quantum computer to couple the quantum codewords 506 to the ancilla qubits 504 in the manner described previously and according the resultant matrix $R_M$ described by Equation 4.

In block 508, the ancilla qubits 504 are measured by the quantum measurement apparatus C (see FIG. 1). Blocks 505 and 508 are repeated for each stabilizer chosen by the computing device (in block 503) until all stabilizers associated with the quantum error correcting code 501 have been measured. After this has been completed, a full set of measurement outcomes 509 is obtained.

In this configuration, the logical parity decoder B may be characterized as including a logical parity channel decoder (not shown) and a logical parity source decoder (not shown). In block 514, the logical parity decoder B performs two sub-processes shown in blocks 511 and 515. In block 511, the computing device implementing the logical parity channel decoder (not shown) estimates the full logical parity syndrome 510 from the full set of measurement outcomes 509 using classical decoding methods associated with the error correcting codes, which are associated with the generator matrices $G_1$ and $G_2$. In block 515, the computing device implementing the logical parity source decoder (not shown) determines whether an error is present in the data qubits from the full logical parity syndrome 510 using decoding methods based on the parity-check matrix $H_L$ and the binary matrix $H_Q$, which may include a look-up table as described previously.

In decision block 512, if the full logical parity syndrome is all zeros, the logical parity decoder D determines that there are no errors in the quantum codewords 506 and the method 500 stops in block 513. When, the method 500 stops, the quantum codewords 506 are returned to the computing device governing the execution of the quantum algorithm. In decision block 512, if the full logical parity syndrome is non-zero, the logical parity decoder D determines, in decision block 512, that one or more errors are present in the quantum codewords 206. When the decision in decision block 512 is "YES," the computing device governing the logical parity decoder D performs the logical parity decoding method 180 (see FIG. 16) to determine the error locations 516. Alternatively, the logical parity decoder D may reconstruct the quantum syndrome for each of the quantum codewords 506 from the full logical parity syndrome 510. In this case, in block 518, the computing device implementing the quantum decoder E (see FIG. 1) may use the quantum syndromes to determine the error locations 516. Finally, in block 220, the error locations 516 are passed to the control hardware implementing the corrective actions to correct the errors in the data qubits of the quantum codewords 506.

This configuration of the logical parity encoder B and the logical parity decoder D with additional binary matrices $G_1$ and $G_2$ and the resultant matrix $R_M$ described by Equation 4 may also be used in the manner described previously for quantum state distillation and multiple-qubit entangled state preparation by signaling a corrective action to the control hardware to discard states with errors.

Computing Device

Figure 18:
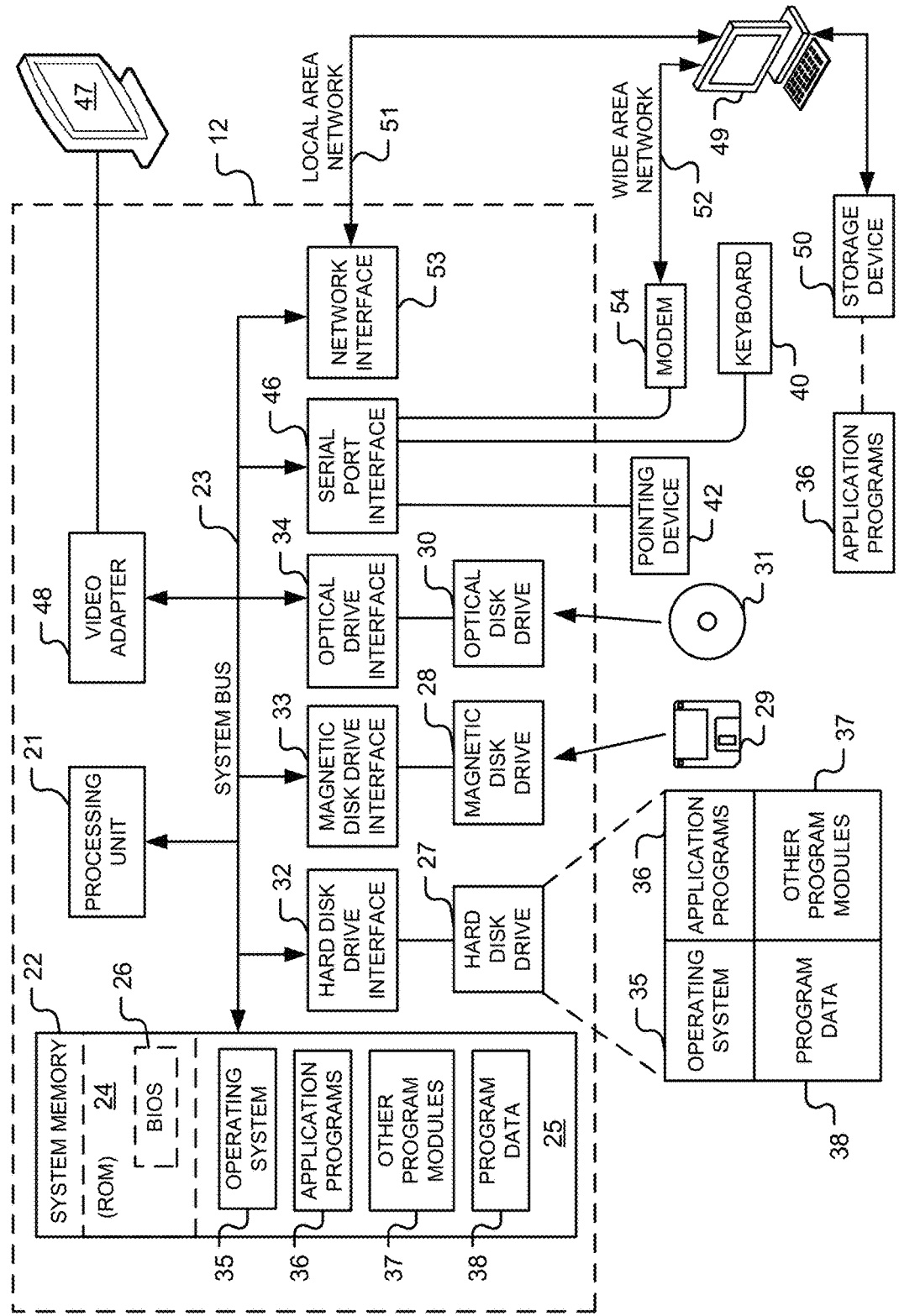
FIG. 18 is a diagram of a hardware environment and an operating environment in which a convention computer used to implement a host processor of the quantum computing system of FIG. 17 may be implemented.

FIG. 18 is a diagram of hardware and an operating environment in conjunction with which implementations of the conventional computer used to implement the host processor 166 (see FIG. 17) may be practiced. The description of FIG. 18 is intended to provide a brief, general description of suitable computer hardware and a suitable computing environment in which implementations may be practiced. The methods 170, 180, 200, 300, 400, and 500 (see FIGS. 15, 16, 11, 12, 13, and 14, respectively) are described in the general context of computer-executable instructions, such as program modules, being executed by a computer. Generally, program modules include routines, programs, objects, components, data structures, etc., that perform particular tasks or implement particular abstract data types.

Moreover, those of ordinary skill in the art will appreciate that implementations may be practiced with other computer system configurations, including hand-held devices, multiprocessor systems, microprocessor-based or programmable consumer electronics, network PCs, minicomputers, mainframe computers, and the like. Implementations may also be practiced in distributed computing environments (e.g., cloud computing platforms) where tasks are performed by remote processing devices that are linked through a communications network. In a distributed computing environment, program modules may be located in both local and remote memory storage devices.

The exemplary hardware and operating environment of FIG. 18 includes a general-purpose computing device in the form of the computing device 12. The computing device 12 may be a conventional computer, a personal computer, a distributed computer, or any other type of computer. By way of non-limiting examples, the computing device 12 may be implemented as a laptop computer, a tablet computer, a web enabled television, a personal digital assistant, a game console, a smartphone, a mobile computing device, a cellular telephone, a desktop personal computer, and the like.

The computing device 12 includes a system memory 22, the processing unit 21, and a system bus 23 that operatively couples various system components, including the system memory 22, to the processing unit 21. There may be only one or there may be more than one processing unit 21, such that the processor of computing device 12 includes a single central-processing unit ("CPU"), or a plurality of processing units, commonly referred to as a parallel processing environment. When multiple processing units are used, the processing units may be heterogeneous. By way of a non-limiting example, such a heterogeneous processing environment may include a conventional CPU, a conventional graphics processing unit ("GPU"), a floating-point unit ("FPU"), combinations thereof, and the like.

The system bus 23 may be any of several types of bus structures including a memory bus or memory controller, a peripheral bus, and a local bus using any of a variety of bus architectures. The system memory 22 may also be referred to as simply the memory, and includes read only memory (ROM) 24 and random access memory (RAM) 25. A basic input/output system (BIOS) 26, containing the basic routines that help to transfer information between elements within the computing device 12, such as during start-up, is stored in ROM 24. The computing device 12 further includes a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD ROM, DVD, or other optical media.

The hard disk drive 27, magnetic disk drive 28, and optical disk drive 30 are connected to the system bus 23 by a hard disk drive interface 32, a magnetic disk drive interface 33, and an optical disk drive interface 34, respectively. The drives and their associated computer-readable media provide nonvolatile storage of computer-readable instructions, data structures, program modules, and other data for the computing device 12. It should be appreciated by those of ordinary skill in the art that any type of computer-readable media which can store data that is accessible by a computer, such as magnetic cassettes, flash memory cards, solid state memory devices ("SSD"), USB drives, digital video disks, Bernoulli cartridges, random access memories (RAMs), read only memories (ROMs), and the like, may be used in the exemplary operating environment. As is apparent to those of ordinary skill in the art, the hard disk drive 27 and other forms of computer-readable media (e.g., the removable magnetic disk 29, the removable optical disk 31, flash memory cards, SSD, USB drives, and the like) accessible by the processing unit 21 may be considered components of the system memory 22.

A number of program modules may be stored on the hard disk drive 27, magnetic disk 29, optical disk 31, ROM 24, or RAM 25, including the operating system 35, one or more application programs 36, other program modules 37, and program data 38. A user may enter commands and information into the computing device 12 through input devices such as a keyboard 40 and pointing device 42. Other input devices (not shown) may include a microphone, joystick, game pad, satellite dish, scanner, touch sensitive devices (e.g., a stylus or touch pad), video camera, depth camera, or the like. These and other input devices are often connected to the processing unit 21 through a serial port interface 46 that is coupled to the system bus 23, but may be connected by other interfaces, such as a parallel port, game port, a universal serial bus (USB), or a wireless interface (e.g., a Bluetooth interface). A monitor 47 or other type of display device is also connected to the system bus 23 via an interface, such as a video adapter 48. In addition to the monitor, computers typically include other peripheral output devices (not shown), such as speakers, printers, and haptic devices that provide tactile and/or other types of physical feedback (e.g., a force feed back game controller).

The input devices described above are operable to receive user input and selections. Together the input and display devices may be described as providing a user interface.

The computing device 12 may operate in a networked environment using logical connections to one or more remote computers, such as remote computer 49. These logical connections are achieved by a communication device coupled to or a part of the computing device 12 (as the local computer). Implementations are not limited to a particular type of communications device. The remote computer 49 may be another computer, a server, a router, a network PC, a client, a memory storage device, a peer device or other common network node, and typically includes many or all of the elements described above relative to the computing device 12. The remote computer 49 may be connected to a memory storage device 50. The logical connections depicted in FIG. 18 include a local-area network (LAN) 51 and a wide-area network (WAN) 52. Such networking environments are commonplace in offices, enterprise-wide computer networks, intranets and the Internet.

Those of ordinary skill in the art will appreciate that a LAN may be connected to a WAN via a modem using a carrier signal over a telephone network, cable network, cellular network, or power lines. Such a modem may be connected to the computing device 12 by a network interface (e.g., a serial or other type of port). Further, many laptop computers may connect to a network via a cellular data modem.

When used in a LAN-networking environment, the computing device 12 is connected to the local area network 51 through a network interface or adapter 53, which is one type of communications device. When used in a WAN-networking environment, the computing device 12 typically includes a modem 54, a type of communications device, or any other type of communications device for establishing communications over the wide area network 52, such as the Internet. The modem 54, which may be internal or external, is connected to the system bus 23 via the serial port interface 46. In a networked environment, program modules depicted relative to the personal computing device 12, or portions thereof, may be stored in the remote computer 49 and/or the remote memory storage device 50. It is appreciated that the network connections shown are exemplary and other means of and communications devices for establishing a communications link between the computers may be used.

The computing device 12 and related components have been presented herein by way of particular example and also by abstraction in order to facilitate a high-level view of the concepts disclosed. The actual technical design and implementation may vary based on particular implementation while maintaining the overall nature of the concepts disclosed.

In some embodiments, the system memory 22 stores computer executable instructions that when executed by one or more processors cause the one or more processors to perform all or portions of one or more of the methods (including the methods 170, 180, 200, 300, 400, and 500 illustrated in FIGS. 15, 16, 11, 12, 13, and 14, respectively) described above. Such instructions may be stored on one or more non-transitory computer-readable media.

The following references are incorporated herein by reference in their entireties.

REFERENCES

[1] William Wesley Peterson, Wesley Peterson, E J Weldon, and E J Weldon. Error-correcting codes. MIT press, 1972.

[2] Sarah J Johnson. Iterative error correction: Turbo, low-density parity-check and repeat-accumulate codes. Cambridge university press, 2009.

[3] Loren Lugosch and Warren J Gross. Learning from the syndrome. In 2018 52nd Asilomar Conference on Signals, Systems, and Computers, pages 594-598. IEEE, 2018.

[4] Ye-Hua Liu and David Poulin. Neural belief-propagation decoders for quantum error-correcting codes. Physical review letters, 122(20):200501, 2019.

[5] Peter W Shor. Fault-tolerant quantum computation. In Proceedings of 37th Conference on Foundations of Computer Science, pages 56-65. IEEE, 1996.

[6] Andrew M Steane. Active stabilization, quantum computation, and quantum state synthesis. Physical Review Letters, 78(11):2252, 1997.

[7] Emanuel Knill. Fault-tolerant postselected quantum computation: Schemes. arXiv preprint quant-ph/0402171, 2004.

[8] Sergey Bravyi and Alexei Kitaev. Universal quantum computation with ideal clifford gates and noisy ancillas. Phys. Rev. A, 71:022316, February 2005.

[9] Ben Reichardt. Quantum universality from magic states distillation applied to css codes. Quantum Information Processing, 4(3):251-264, 2005.

[10] Campbell, Earl T., and Dan E. Browne. "On the structure of protocols for magic state distillation." In *Workshop on Quantum Computation, Communication, and Cryptography*, pp. 20-32. Springer, Berlin, Heidelberg, 2009.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Conjunctive language, such as phrases of the form "at least one of A, B, and C," or "at least one of A, B and C," (i.e., the same phrase with or without the Oxford comma) unless specifically stated otherwise or otherwise clearly contradicted by context, is otherwise understood with the context as used in general to present that an item, term, etc., may be either A or B or C, any nonempty subset of the set of A and B and C, or any set not contradicted by context or otherwise excluded that contains at least one A, at least one B, or at least one C. For instance, in the illustrative example of a set having three members, the conjunctive phrases "at least one of A, B, and C" and "at least one of A, B and C"

refer to any of the following sets: {A}, {B}, {C}, {A, B}, {A, C}, {B, C}, {A, B, C}, and, if not contradicted explicitly or by context, any set having {A}, {B}, and/or {C} as a subset (e.g., sets with multiple "A"). Thus, such conjunctive language is not generally intended to imply that certain embodiments require at least one of A, at least one of B, and at least one of C each to be present. Similarly, phrases such as "at least one of A, B, or C" and "at least one of A, B or C" refer to the same as "at least one of A, B, and C" and "at least one of A, B and C" refer to any of the following sets: {A}, {B}, {C}, {A, B}, {A, C}, {B, C}, {A, B, C}, unless differing meaning is explicitly stated or clear from context.

Accordingly, the invention is not limited except as by the appended claims.

The invention claimed is:

1. A method for use with a quantum computing system comprising quantum hardware components and implementing a logical parity encoder, the method comprising:
    obtaining, by the logical parity encoder, at least one quantum check operator, the at least one quantum check operator being based on at least one multiple-qubit Pauli operator;
    obtaining, by the logical parity encoder, a binary matrix, the binary matrix being based at least in part on a classical error correcting code, the binary matrix comprising a plurality of entries each having a value selected from a set of two values;
    generating, by the logical parity encoder, a specification from the binary matrix and the at least one quantum check operator, the specification indicating which ancilla qubits are to be coupled to which data qubits, the data qubits being prepared as a plurality of multiple-qubit entangled states; and
    directing, by the logical parity encoder, the quantum hardware components to couple each of selected ones of the data qubits to one or more of the ancilla qubits in accordance with the couplings indicated in the specification, each of the plurality of multiple-qubit entangled states being coupled to a plurality of the ancilla qubits.

2. The method of claim 1, wherein the two values of the set are one and zero.

3. The method of claim 1, wherein the specification is generated based on a resultant matrix that is a matrix Kronecker product of the binary matrix and a binary representation of the at least one quantum check operator, and
    the binary representation comprises a plurality of operator values each being one of the two values.

4. The method of claim 3, wherein the resultant matrix comprises a plurality of binary resultant values arranged in a plurality of rows and a plurality of columns,
    the plurality of rows comprises a different row corresponding to each of the ancilla qubits,
    the plurality of columns comprises a different column corresponding to each of the data qubits,
    the specification indicates a particular one of the ancilla qubits is to be coupled to a particular one of the data qubits when a binary resultant value in a particular one of the plurality of rows corresponding to the particular ancilla qubit and a particular one of the plurality of columns corresponding to the particular data qubit has a first of the two values, and
    the specification indicates the particular ancilla qubit is not to be coupled to the particular data qubit when the binary resultant value in the particular row and the particular column has a second of the two values.

5. The method of claim 1, wherein the quantum hardware components couple each of the selected data qubits to the one or more ancilla qubits with at least one quantum logic gate.

6. The method of claim 5, wherein each of the at least one quantum logic gate is a multiple-qubit logic gate or a single qubit gate.

7. The method of claim 5, wherein the at least one controlled-NOT gate or a controlled-PHASE gate.

8. The method of claim 1, wherein the plurality of multiple-qubit entangled states are a plurality of quantum codewords, and
    each of the plurality of quantum codewords encodes one or more logical qubits.

9. The method of claim 1, wherein the binary matrix is (a) a parity-check matrix $H_L$ of the classical error correcting code, (b) a sub-parity-check matrix $P_L$ that is a portion of the parity-check matrix $H_L$, or (c) a generator matrix G of a parity-check code.

10. The method of claim 1, wherein the binary matrix is a sub-parity-check matrix $P_L$ obtained from a parity-check matrix $H_L$ of the classical error correcting code, and
    together the sub-parity-check matrix $P_L$ and an identity matrix I form the parity-check matrix $H_L$ in accordance with a following systematic form: $H_L=[I\ P_L]$.

11. The method of claim 1, wherein the classical error correcting code is an original classical error correcting code, and the method further comprises:
    performing, by the logical parity encoder, modulo-2 multiplication on the binary matrix and a first generator matrix before the logical parity encoder generates the specification, a first classical error correcting code having the first generator matrix, the first classical error correcting code being different from the original classical error correcting code.

12. The method of claim 11, wherein the at least one quantum check operator is a single quantum check operator, and the method further comprises:
    pre-multiplying, by the logical parity encoder, a binary representation of the single quantum check operator by a binary matrix $G_2$ before the logical parity encoder generates the specification, the binary matrix $G_2$ being a second generator matrix of a second classical error correcting code.

13. The method of claim 1, wherein the at least one quantum check operator is a single quantum check operator, the classical error correcting code is a first classical error correcting code, and the method further comprises:
    pre-multiplying, by the logical parity encoder, a binary representation of the single quantum check operator by a generator matrix of a second classical error correcting code before the logical parity encoder generates the specification.

14. The method of claim 1, wherein the ancilla qubits are encoded into ancilla blocks comprised of multiple-qubit entangled states before the logical parity encoder directs the quantum hardware components to couple each of the selected data qubits to the one or more ancilla qubits.

15. The method of claim 1, wherein the data qubits are encoded as a plurality of quantum codewords according to a quantum error correcting code before the logical parity encoder directs the quantum hardware components to couple each of the selected data qubits to the one or more ancilla qubits, and
    the at least one quantum check operator comprises multiple quantum check operators that are stabilizers of the quantum error correcting code.

16. The method of claim 1, wherein the at least one quantum check operator comprises multiple verification check operators configured to verify the data qubits were prepared as the plurality of multiple qubit-entangled states.

17. The method of claim 1, wherein the at least one quantum check operator comprises multiple quantum check operators,
- the specification is generated based at least in part on a resultant matrix that is a matrix Kronecker product of the binary matrix and a binary representation of the multiple quantum check operators, and
- the binary representation comprises a quantum check operator binary matrix in which each of the multiple quantum check operators occupies a different row of the quantum check operator binary matrix.

18. The method of claim 1 for use with the quantum hardware components comprising control hardware and the quantum computing system implementing a logical parity decoder and a measurement apparatus, wherein configuration data comprises the at least one quantum check operator and the binary matrix, and the method further comprises:
- (i) obtaining, by measuring the ancilla qubits with the measurement apparatus, one or more binary measurement outcomes;
- (ii) decoding, by the logical parity decoder, a location for each of one or more errors in the data qubits from the one or more binary measurement outcomes using the configuration data; and
- (iii) sending, by the logical parity decoder, signals to the control hardware of the quantum computing system instructing the control hardware to perform one or more corrective actions on the data qubits.

19. The method of claim 18, wherein the signals sent by the logical parity decoder instruct the control hardware to correct any of the one or more errors.

20. The method of claim 18, wherein the signals sent by the logical parity decoder instruct the control hardware to discard at least one of the data qubits with at least one of the one or more errors.

21. The method of claim 18, wherein the at least one quantum check operator is configured to distill a desired quantum resource state, and
- the signals sent by the logical parity decoder instruct the control hardware to (a) discard any of the plurality of multiple-qubit entangled states in which at least one of the data qubits encoded therein has an error of the one or more errors, and (b) join any of the plurality of multiple-qubit entangled states in which the data qubits encoded therein do not include any of the one or more errors.

22. The method of claim 18, wherein the logical parity decoder comprises a look-up table that maps a plurality of measurement outcomes to a plurality of error patterns, and decoding the location of a selected one of the one or more errors comprises:
- looking up a selected one of the one or more binary measurement outcomes in the look-up table to obtain a current error pattern, and
- identifying the one or more corrective actions to perform on at least some of the data qubits based on the current error pattern.

23. The method of claim 22, further comprising:
- obtaining the look-up table from a computing device before the logical parity decoder obtains the current error pattern, the computing device having used the configuration data to precompute the look-up table before the logical parity decoder obtains the current error pattern, the look-up table comprising all correctable error patterns.

24. The method of claim 18, wherein the logical parity decoder comprises a look-up table that maps a plurality of measurement outcomes to a plurality of corrective actions, and decoding the location of a selected one of the one or more errors comprises:
- looking up a selected one of the one or more binary measurement outcomes in the look-up table to obtain the one or more corrective actions.

25. The method of claim 24, further comprising:
- obtaining the look-up table from a computing device before the logical parity decoder obtains the one or more corrective actions, the computing device having used the configuration data to precompute the look-up table before the logical parity decoder obtains the one or more corrective actions, the look-up table comprising all available corrective actions.

26. The method of claim 18, wherein the binary matrix is a sub-parity-check matrix $P_L$ obtained from a parity-check matrix $H_L$ of the classical error correcting code, the logical parity decoder comprises a look-up table that maps a plurality of measurement outcomes to a plurality of error patterns, and decoding the location of a selected one of the one or more errors comprises:
- when the look-up table includes a selected one of the one or more binary measurement outcomes, obtaining, as a current error pattern, a first error pattern corresponding to the selected measurement outcome,
- when the look-up table does not include the selected measurement outcome, identifying, with a bounded distance decoder, a closest measurement outcome in the look-up table to the selected measurement outcome, and obtaining, as the current error pattern, a second error pattern corresponding to the closest measurement outcome, and
- identifying the one or more corrective actions based on the current error pattern.

27. The method of claim 18, wherein the binary matrix is a sub-parity-check matrix $P_L$ obtained from a parity-check matrix $H_L$ of the classical error correcting code, the logical parity decoder comprises a look-up table that maps a plurality of measurement outcomes to a plurality of corrective actions, and decoding the location of a selected one of the one or more errors comprises:
- when the look-up table includes a selected one of the one or more binary measurement outcomes, obtaining, as the one or more corrective actions, any corrective actions corresponding to the selected measurement outcome, and
- when the look-up table does not include the selected measurement outcome, identifying, with a bounded distance decoder, a closest measurement outcome in the look-up table to the selected measurement outcome, and obtaining, as the one or more corrective actions, any corrective actions corresponding to the closest measurement outcome.

28. The method of claim 18, wherein the logical parity decoder is a neural belief decoder or an algebraic decoder configured to decode the location for each of one or more errors from the one or more binary measurement outcomes using the configuration data.

29. The method of claim 18, wherein the ancilla qubits are encoded into ancilla blocks comprised of multiple-qubit entangled states before the logical parity encoder directs the quantum hardware components to couple each of the selected data qubits to the one or more of the ancilla qubits in accordance with the couplings indicated in the specification.

30. The method of claim 18, wherein the at least one quantum check operator is at least one first quantum check operator, the specification is a first specification, the plurality of the ancilla qubits is a first plurality of the ancilla qubits, the one or more binary measurement outcomes are one or more first binary measurement outcomes, the location is a first location, the one or more errors are one or more first errors, the configuration data is first configuration data, the signals are first signals, the one or more corrective actions are one or more first corrective actions, error types comprise bit-flips and phase flips, the at least one first quantum check operator detects a first one of the error types, at least one second quantum check operator detects a second one of the error types, the first error type being different from the second error type, second configuration data comprises the at least one second quantum check operator and the binary matrix, and the method further comprises:
  generating, by the logical parity encoder, a second specification from the second configuration data;
  directing, by the logical parity encoder, the quantum hardware components to couple the data qubits to the ancilla qubits in accordance with couplings indicated in the second specification, each of the plurality of multiple-qubit entangled states being coupled to a second plurality of the ancilla qubits;
  obtaining, by measuring the ancilla qubits with the measurement apparatus, one or more second binary measurement outcomes;
  decoding, by the logical parity decoder, a second location for each of one or more second errors in the data qubits from the one or more second binary measurement outcomes using the second configuration data; and
  sending, by the logical parity decoder, second signals to the control hardware of the quantum computing system instructing the control hardware to perform one or more second corrective actions on the data qubits.

31. The method of claim 18 for use with a quantum algorithm being executed by the quantum computing system and being performed using the data qubits, the method further comprising:
  waiting, by the logical parity decoder, until execution of the quantum algorithm completes to send the signals to the control hardware.

32. The method of claim 1 for use with the quantum hardware components comprising a measurement apparatus, and the quantum computing system implementing a logical parity channel decoder, and a logical parity decoder, wherein the classical error correcting code is an original classical error correcting code, before the logical parity encoder generates the specification, the binary matrix is pre-multiplied by a first generator matrix of a first linear error correcting code, the first linear error correcting code is different from the original classical error correcting code, the at least one quantum check operator is pre-multiplied by a second generator matrix of a second linear error correcting code, and the method further comprises:
  (i) obtaining, by the measurement apparatus, measurement outcomes;
  (ii) reconstructing, with the logical parity channel decoder configured for the first linear error correcting code and the second linear error correcting code, a logical parity syndrome from the measurement outcomes using configuration data, the configuration data comprising the at least one quantum check operator and the binary matrix;
  (iii) transmitting, by the logical parity channel decoder, the logical parity syndrome to the logical parity decoder, the logical parity decoder being configured to identify locations of errors in the data qubits; and
  (iv) sending, by the logical parity decoder, signals to the quantum hardware components instructing the quantum hardware components to perform one or more corrective actions.

33. The method of claim 1 for use with the quantum computing system implementing a logical parity decoder and a quantum decoder, further comprising:
  (i) obtaining, by the logical parity decoder, measurement outcomes;
  (ii) reconstructing, by the logical parity decoder, quantum error syndromes from the measurement outcomes;
  (iii) transmitting, by the logical parity decoder, the quantum error syndromes to a quantum decoder configured to identify a location of an error in the data qubits; and
  (iv) sending, by the quantum decoder, signals to the quantum hardware components instructing the quantum hardware components to perform one or more corrective actions based on the error.

34. A method for use with a quantum computing system comprising a configurable quantum circuit, and the quantum computing system implementing a quantum encoder and a logical parity encoder, the method comprising:
  directing, by the quantum encoder, the configurable quantum circuit to couple data qubits into a plurality of multiple-qubit entangled states in accordance with at least one quantum check operator specified by a quantum error correcting code;
  generating, by the logical parity encoder, a specification for a quantum circuit that couples each of the plurality of multiple-qubit entangled states to multiple ancilla qubits, the logical parity encoder generating the specification based at least in part on the at least one quantum check operator and a classical error correcting code; and
  directing, by the logical parity encoder, the configurable quantum circuit to implement the quantum circuit and couple each of the plurality of multiple-qubit entangled states to the multiple ancilla qubits.

35. The method of claim 34 for use with the quantum computing system comprising a measurement apparatus and implementing a logical parity decoder, the method further comprising:
  obtaining, by the logical parity decoder, measurement outcomes from the measurement apparatus, the measurement apparatus having obtained the measurement outcomes by measuring the ancilla qubits,
  using, by the logical parity decoder, the specification, the at least one quantum check operator, and the classical error correcting code to decode at least one error location from the measurement outcomes, the at least one error location identifying at least one of the data qubits coupled into at least one of the plurality of multiple-qubit entangled states; and
  instructing, by the logical parity decoder, the configurable quantum circuit to perform one or more corrective actions on the identified at least one data qubit based on the at least one error location.

36. The method of claim 34 for use with the quantum computing system comprising a measurement apparatus and implementing a logical parity decoder and a quantum decoder, the method further comprising:

obtaining, by the logical parity decoder, measurement outcomes from the measurement apparatus, the measurement apparatus having obtained the measurement outcomes by measuring the ancilla qubits;

obtaining, by the logical parity decoder, a quantum error syndrome based at least in part on the specification, the at least one quantum check operator, and the classical error correcting code;

passing, by the logical parity decoder, the quantum error syndrome to the quantum decoder;

decoding, by the quantum decoder, at least one error location from the measurement outcomes, the at least one error location identifying at least one of the data qubits coupled into at least one of the plurality of multiple-qubit entangled states; and instructing, by the quantum decoder, the configurable quantum circuit to perform one or more corrective actions on the identified at least one data qubit based on the at least one error location.

37. A quantum computing system comprising:

(i) a quantum data plane storing ancilla qubits and data qubits, the quantum data plane comprising a configurable quantum circuit and a measurement apparatus;

(ii) a control and measurement plane connected to the quantum data plane, the control and measurement plane being operable to configure the configurable quantum circuit, obtain measurement data from the measurement apparatus, and convert the measurement data to measurement outcomes; and (ii) a programmable computing device connected to the control and measurement plane, the programmable computing device comprising at least one processor connected to memory storing instructions executable by the at least one processor, the instructions, when executed by the at least one processor, causing the at least one processor to:

(a) generate a specification from configuration data comprising a binary matrix and at least one quantum check operator, the specification indicating which of the data qubits are to be coupled to which ancilla qubits, (b) instruct the control and measurement plane to configure the configurable quantum circuit in accordance with the specification to thereby couple selected ones of the data qubits to one or more of the ancilla qubits, (c) instruct the control and measurement plane to obtain, from the measurement apparatus, the measurement data from the ancilla qubits, (d) receive the measurement outcomes from the control and measurement plane, (e) use the specification and the configuration data to decode at least one error location from the measurement outcomes, and (f) instruct the control and measurement plane to perform one or more corrective actions on the data qubits based on the at least one error location.

38. The quantum computing system of claim 37, wherein the instructions, when executed by the at least one processor, cause the at least one processor to:

instruct the control and measurement plane to configure the configurable quantum circuit to couple the data qubits into a plurality of quantum codewords using a quantum error correcting code before the specification is generated, the quantum error correcting code specifying the at least one quantum check operator.

39. The quantum computing system of claim 37, wherein the instructions, when executed by the at least one processor, cause the at least one processor to:

instruct the control and measurement plane to configure the configurable quantum circuit to couple the data qubits into a plurality of multiple-qubit entangled states using a quantum error correcting code before the specification is generated, the quantum error correcting code specifying the at least one quantum check operator, the at least one quantum check operator being at least one verification check operator that the configurable quantum circuit implements as at least one verification circuit.

* * * * *